United States Patent
Kostakis et al.

(10) Patent No.: US 10,812,664 B2
(45) Date of Patent: Oct. 20, 2020

(54) POWER TRANSMISSION SYSTEM FOR WIRELESS COMMUNICATION SYSTEMS

(71) Applicant: Raycap S.A., Maroussi, Athens (GR)

(72) Inventors: Grigoris Kostakis, Athens (GR); Anestis Kolovos, Serres (GR); Nikolaol Tsakiridis, Drama (GR); Michael C. Bloxham, Mead, WA (US); Shawn A. Warner, Rathdrum, ID (US); Fotis Xepapas, Drama (GR); Zafiris G. Politis, St. Stefanos (GR)

(73) Assignee: RAYCAP S.A., Athens (GR)

( * ) Notice: Subject to any disclaimer, the term of this patent is extended or adjusted under 35 U.S.C. 154(b) by 309 days.

(21) Appl. No.: 15/875,795

(22) Filed: Jan. 19, 2018

(65) Prior Publication Data
US 2018/0213091 A1 Jul. 26, 2018

Related U.S. Application Data

(60) Provisional application No. 62/448,637, filed on Jan. 20, 2017.

(51) Int. Cl.
*H04M 19/00* (2006.01)
*H02M 3/156* (2006.01)
(Continued)

(52) U.S. Cl.
CPC ...... *H04M 19/008* (2013.01); *G01R 19/2513* (2013.01); *G05F 1/465* (2013.01); *H02M 3/156* (2013.01); *H04B 3/548* (2013.01)

(58) Field of Classification Search
CPC .. H04M 19/008; G01R 19/2513; G05F 1/465; H02M 3/156; H04B 3/548
(Continued)

(56) References Cited

U.S. PATENT DOCUMENTS 3,066,181 A    11/1962   Archibald
3,165,372 A    1/1965   Jacobs
(Continued)

FOREIGN PATENT DOCUMENTS

DE    202005021740 U1    8/2009
DE    CH698717 B1    10/2009
(Continued)

OTHER PUBLICATIONS

International Search Report and Written Opinion for PCT/US2018/014553 dated Apr. 6, 2018; 11 pages.
(Continued)

*Primary Examiner* — Lee Nguyen

(74) *Attorney, Agent, or Firm* — Schwabe Williamson & Wyatt, PC

(57) ABSTRACT

A power transmission system includes a voltage measurement device located on a tower or rooftop for measuring a voltage ($V_{RRH}$) at a top end of a DC cable connected to a remote radio head (RRH). A voltage control system receives an input voltage ($V_{IN}$) from a DC power supply and generates an output voltage ($V_{OUT}$) at a base end of the DC cable. The voltage control system calculates a voltage drop on the DC cable based on the $V_{RRH}$ measurement and then adds different voltage steps to $V_{IN}$ so $V_{OUT}$ compensates for the voltage drop. Calculating the voltage drop allows the PTS to more efficiently supply power to RRHs without having to increase the size of DC power cables.

36 Claims, 19 Drawing Sheets

(51) Int. Cl.
G05F 1/46 (2006.01)
G01R 19/25 (2006.01)
H04B 3/54 (2006.01)

(58) Field of Classification Search
USPC .......................................................... 455/572
See application file for complete search history.

(56) References Cited

U.S. PATENT DOCUMENTS

| | | | |
|---|---|---|---|
| 3,247,479 A | 4/1966 | Knipping |
| 3,659,189 A | 4/1972 | Kiviranna |
| 3,659,277 A | 4/1972 | Brown |
| 3,876,076 A | 4/1975 | Hazelhurst |
| 3,976,351 A | 8/1976 | Hopfe |
| 4,030,061 A | 6/1977 | Gaskell |
| 4,236,190 A | 11/1980 | Hollingsead |
| 4,918,565 A | 4/1990 | King |
| 4,976,508 A | 12/1990 | Okura |
| 5,030,128 A | 7/1991 | Herron |
| 5,311,397 A | 5/1994 | Harshberger |
| D361,314 S | 8/1995 | Ryan |
| D362,232 S | 9/1995 | Ryan |
| 5,473,718 A | 12/1995 | Sommer |
| 5,491,766 A | 2/1996 | Huynh |
| 5,530,215 A | 6/1996 | Couvreur |
| 5,555,153 A | 9/1996 | Frederiksen |
| 5,602,532 A | 2/1997 | Ryan |
| 5,627,721 A | 5/1997 | Figueiredo |
| 5,651,698 A | 7/1997 | Locati |
| 5,701,227 A | 12/1997 | Ryan |
| 5,717,685 A | 2/1998 | Abraham |
| 5,790,360 A | 8/1998 | Ryan |
| 5,805,757 A | 9/1998 | Bloom |
| 5,903,693 A | 5/1999 | Brown |
| 5,914,845 A | 6/1999 | Chase |
| 5,953,193 A | 9/1999 | Ryan |
| 5,966,282 A | 10/1999 | Ryan |
| 5,969,932 A | 10/1999 | Ryan |
| 6,031,706 A | 2/2000 | Nabell |
| 6,037,544 A | 3/2000 | Lee |
| 6,038,119 A | 3/2000 | Atkins |
| 6,074,247 A | 6/2000 | Hall |
| 6,114,632 A | 9/2000 | Planas, Sr. |
| 6,122,156 A | 9/2000 | Nabell |
| 6,125,048 A | 9/2000 | Loughran |
| 6,389,214 B1 | 5/2002 | Smith |
| 6,418,262 B1 | 7/2002 | Puetz |
| 6,430,020 B1 | 8/2002 | Atkins |
| 6,535,369 B1 | 3/2003 | Redding |
| 6,556,402 B2 | 4/2003 | Kizis |
| 6,623,315 B1 | 9/2003 | Roderick |
| 6,640,111 B1 | 10/2003 | Shapira |
| 6,654,223 B1 | 11/2003 | Bippus |
| 6,715,619 B2 | 4/2004 | Kim |
| 6,719,615 B1 | 4/2004 | Molnar |
| 6,729,902 B2 | 5/2004 | Martich |
| 6,738,555 B1 | 5/2004 | Cooke |
| 6,748,155 B2 | 6/2004 | Kim |
| 6,763,171 B2 | 7/2004 | D'Inca |
| 6,771,861 B2 | 8/2004 | Wagner |
| 6,792,190 B2 | 9/2004 | Xin |
| 6,804,447 B2 | 10/2004 | Smith |
| 6,809,258 B1 | 10/2004 | Dang |
| 6,813,510 B1 | 11/2004 | Kunzinger |
| 6,851,966 B1 | 2/2005 | Tomasino |
| 6,876,533 B1 | 4/2005 | Ryan |
| 6,937,807 B2 | 8/2005 | Franklin |
| 7,008,256 B2 | 3/2006 | Poiraud |
| 7,035,073 B2 | 4/2006 | Bennett |
| 7,228,047 B1 | 6/2007 | Szilagyi |
| 7,218,828 B2 | 8/2007 | Feustel |
| 7,302,149 B2 | 11/2007 | Swam |
| 7,327,926 B2 | 2/2008 | Barth |
| 7,376,322 B2 | 5/2008 | Zimmel |
| 7,397,673 B1 | 7/2008 | Wilson |
| 7,433,169 B2 | 10/2008 | Kamel |
| 7,460,381 B2 | 12/2008 | Lanni |
| 7,508,687 B2 | 3/2009 | Manolescu |
| 7,526,174 B2 | 4/2009 | Leon |
| 7,664,363 B1 | 2/2010 | Mowery, Sr. |
| 7,739,522 B2 | 6/2010 | Festo |
| 7,768,794 B1 | 8/2010 | Wilson |
| RE41,655 E | 9/2010 | Woodhead |
| 7,873,252 B2 | 1/2011 | Smrha |
| 7,894,782 B2 | 2/2011 | Rofougaran |
| 7,946,863 B2 | 5/2011 | Loch |
| 7,949,315 B2 | 5/2011 | Rofougaran |
| 7,972,067 B2 | 7/2011 | Haley |
| 8,021,189 B2 | 9/2011 | Zayas |
| 8,111,966 B2 | 2/2012 | Holmberg |
| 8,121,457 B2 | 2/2012 | Zimmel |
| 8,180,192 B2 | 5/2012 | Zimmel |
| 8,279,067 B2 | 10/2012 | Berger |
| 8,383,521 B2 | 2/2013 | Nishimura et al. |
| 8,401,497 B2 | 3/2013 | Rofougaran |
| 8,401,501 B2 | 3/2013 | Rofougaran |
| 8,412,385 B2 | 4/2013 | Brumett, Jr. |
| 8,457,461 B2 | 6/2013 | Ott |
| 8,467,655 B2 | 6/2013 | German |
| 8,490,799 B2 | 7/2013 | Knight |
| 8,521,100 B2 | 8/2013 | Rofougaran |
| 8,620,549 B2 | 8/2013 | Rofougaran |
| 8,526,200 B2 | 9/2013 | Miller |
| 8,526,893 B2 | 9/2013 | Rofougaran |
| 8,547,164 B2 | 10/2013 | Flores |
| 8,566,627 B2 | 10/2013 | Halepete |
| 8,577,359 B2 | 11/2013 | Wesby |
| 8,588,606 B2 | 11/2013 | Watte |
| 8,600,318 B2 | 12/2013 | Rofougaran |
| 8,730,639 B1 | 5/2014 | Wilson |
| 8,754,622 B2 | 6/2014 | Dobkin |
| 8,780,519 B2 | 7/2014 | Miller |
| 8,810,990 B1 | 8/2014 | Miller |
| 8,831,395 B2 | 9/2014 | Sievers |
| 8,839,594 B2 | 9/2014 | Smith |
| 8,873,926 B2 | 10/2014 | Beamon |
| 8,938,143 B2 | 1/2015 | Do |
| 8,989,548 B2 | 3/2015 | Kopf |
| 8,995,106 B2 | 3/2015 | Miller |
| 9,049,500 B2 | 6/2015 | Conner |
| 9,057,862 B2 | 6/2015 | Strasser |
| 9,099,860 B2 | 8/2015 | Martinez |
| 9,140,872 B2 | 9/2015 | Sedor |
| 9,179,500 B2 | 11/2015 | Yu |
| 9,281,866 B2 | 3/2016 | Smentek |
| 9,448,576 B2 | 9/2016 | Chamberlain |
| 9,575,277 B2 | 2/2017 | Bakatsias |
| 9,640,986 B2 | 5/2017 | Politis |
| 9,673,904 B2 | 6/2017 | Palanisamy |
| 10,429,604 B2 | 10/2019 | Bakatsias |
| 2001/0053971 A1 | 12/2001 | Demetrescu |
| 2002/0055306 A1 | 5/2002 | Jenks |
| 2002/0150372 A1 | 10/2002 | Schray |
| 2002/0196593 A1 | 12/2002 | Kizis |
| 2003/0027521 A1 | 2/2003 | Yip |
| 2003/0085621 A1 | 5/2003 | Potega |
| 2003/0113086 A1 | 6/2003 | Jun |
| 2003/0148668 A1 | 8/2003 | Lias |
| 2004/0119386 A1 | 6/2004 | Guidez |
| 2004/0198451 A1 | 10/2004 | Varghese |
| 2004/0246693 A1 | 12/2004 | Lloyd |
| 2005/0036262 A1 | 2/2005 | Siebenthall |
| 2005/0042920 A1 | 2/2005 | Poiraud |
| 2005/0094359 A1 | 5/2005 | Lee |
| 2005/0157461 A1 | 7/2005 | Cauthron |
| 2006/0139836 A1 | 6/2006 | Anthony |
| 2006/0153362 A1 | 7/2006 | Bloodworth |
| 2007/0024372 A1 | 2/2007 | Hagen |
| 2007/0093204 A1 | 4/2007 | Kincard |
| 2007/0163801 A1 | 7/2007 | Coffey |
| 2007/0217101 A1 | 9/2007 | Carter |
| 2008/0037188 A1 | 2/2008 | Wilson |
| 2008/0106881 A1 | 5/2008 | Tari |
| 2008/0117555 A1 | 5/2008 | Wilson |

(56) References Cited

U.S. PATENT DOCUMENTS

| | | |
|---|---|---|
| 2008/0139045 A1 | 6/2008 | Ho |
| 2008/0186667 A1 | 8/2008 | Verdelli |
| 2008/0247112 A1 | 10/2008 | Benedetto |
| 2008/0272654 A1 | 11/2008 | Lontka |
| 2008/0278889 A1 | 11/2008 | Briggs |
| 2008/0298762 A1 | 12/2008 | Hawley |
| 2008/0310060 A1 | 12/2008 | Metral |
| 2009/0103218 A1 | 4/2009 | Ryan |
| 2009/0103881 A1 | 4/2009 | Gonzalez |
| 2009/0226143 A1 | 9/2009 | Beck |
| 2009/0238531 A1 | 9/2009 | Holmberg |
| 2009/0257727 A1 | 10/2009 | Laurisch |
| 2010/0034507 A1 | 2/2010 | Sielaff |
| 2010/0054676 A1 | 3/2010 | Cooke |
| 2010/0181840 A1 | 7/2010 | Coulson |
| 2010/0259871 A1 | 10/2010 | Ewing |
| 2011/0101937 A1 | 5/2011 | Dobkin |
| 2011/0135316 A1 | 6/2011 | Fankhauser |
| 2011/0237299 A1 | 9/2011 | Boss |
| 2012/0043432 A1 | 2/2012 | Heitmeyer |
| 2012/0051710 A1 | 3/2012 | Zeng |
| 2012/0069882 A1 | 3/2012 | Nino |
| 2012/0092835 A1 | 4/2012 | Miller |
| 2012/0114295 A1 | 5/2012 | Guzzo |
| 2012/0200978 A1 | 8/2012 | Miller |
| 2012/0200979 A1 | 8/2012 | Miller |
| 2012/0230636 A1 | 9/2012 | Blockley |
| 2012/0269509 A1 | 10/2012 | Hultermans |
| 2012/0317426 A1 | 12/2012 | Hunter, Jr. |
| 2012/0319485 A1 | 12/2012 | Ewing |
| 2013/0003677 A1 | 1/2013 | Yu |
| 2013/0039629 A1 | 2/2013 | Krampotich |
| 2013/0051440 A1 | 2/2013 | Rofougaran |
| 2013/0084050 A1 | 4/2013 | Vastmans |
| 2013/0114930 A1 | 5/2013 | Smith |
| 2013/0146355 A1 | 6/2013 | Strasser |
| 2013/0170801 A1 | 7/2013 | Do |
| 2013/0215804 A1 | 8/2013 | Lu |
| 2013/0294735 A1 | 11/2013 | Burris |
| 2013/0308915 A1 | 11/2013 | Buff |
| 2013/0340361 A1 | 12/2013 | Rogers |
| 2014/0168842 A1 | 6/2014 | Martinez |
| 2014/0219622 A1 | 8/2014 | Coan |
| 2014/0248028 A1 | 9/2014 | Campbell |
| 2014/0314388 A1 | 10/2014 | Alberts |
| 2014/0376909 A1 | 12/2014 | Frisken |
| 2015/0006095 A1 | 1/2015 | Voisine |
| 2015/0109710 A1 | 4/2015 | Politis |
| 2015/0155669 A1 | 6/2015 | Chamberlain |
| 2015/0155706 A1 | 6/2015 | Miller |
| 2015/0168974 A1 | 6/2015 | Mascarenhas |
| 2015/0234399 A1 | 8/2015 | Chamberlain |
| 2015/0234405 A1 | 8/2015 | Chamberlain |
| 2015/0334476 A1 | 11/2015 | Smith |
| 2016/0043806 A1 | 2/2016 | Maricevic |
| 2016/0139355 A1 | 5/2016 | Petersen |
| 2016/0231524 A1 | 8/2016 | Womack |
| 2016/0342168 A1 | 11/2016 | Chamberlain et al. |
| 2017/0123175 A1 | 5/2017 | Van Baelen |
| 2018/0157000 A1 | 6/2018 | Miller |
| 2018/0159319 A1 | 6/2018 | Miller |
| 2018/0231731 A1 | 8/2018 | Bakatsias |
| 2019/0258280 A1* | 8/2019 | Chamberlain ..... G01R 19/2513 |

FOREIGN PATENT DOCUMENTS

| | | |
|---|---|---|
| DE | 102012008923 B4 | 9/2014 |
| DE | 102011111288 B4 | 3/2018 |
| DE | 102011111399 B4 | 5/2018 |
| EP | 0095539 A1 | 12/1983 |
| EP | 0660287 A1 | 6/1995 |
| EP | 0942303 A1 | 9/1999 |
| EP | 1855365 A1 | 11/2007 |
| EP | 2005854158 | 11/2007 |
| EP | 2469661 A1 | 6/2012 |
| EP | 2536035 A1 | 12/2012 |
| GB | 0637657 A | 5/1950 |
| GB | 2421641 A | 6/2006 |
| GB | 2452780 A | 3/2009 |
| JP | 2005317472 A | 11/2005 |
| KR | 10-2010-0048227 A | 5/2010 |
| KR | 10-2010-0069332 A | 6/2010 |
| WO | 2006/076120 A1 | 7/2006 |
| WO | 2008/059212 A1 | 5/2008 |
| WO | 2010/024847 A2 | 3/2010 |
| WO | 2012/038104 A1 | 3/2012 |
| WO | 2012/108929 A1 | 8/2012 |
| WO | 2012/108930 A1 | 8/2012 |
| WO | 2013/055591 A2 | 4/2013 |
| WO | 2013/165657 A1 | 11/2013 |
| WO | 2014/009255 A1 | 1/2014 |
| WO | 2014/118227 A1 | 8/2014 |
| WO | 2014/134154 A1 | 9/2014 |
| WO | 2018/136812 A1 | 7/2018 |

OTHER PUBLICATIONS

GE Product Data Sheet, CP2000DC54-PE Compact Power Line DC/DC Converter, Aug. 20, 2013, www.ge.com/powerelectronics; 15 pages.

Keithley Product Sheet, Single-Channel Programmable DC Power Supplies, Series 2200, undated; www.keithly.com; 4 pages.

CPRI Link Mobile Field Testing; AES (Advanced Embedded Solutions), aes-eu.com; Jun. 14, 2014; retrieved from the Internet Jun. 8, 2017 at <http://aes-eu.com/mobile-field-testing.php>; 4 pages.

FIS, the Solutionists, "High Density C-ran CPRI Interface Panel" Product Catalog, Rev. A; May 2015; Oriskany, New York; 2 pages.

FIS, the Solutionists, CPRI Interface Panel Drawer with Integrated Cable Management; Sep. 27, 2015; ubeity.squarespace.com; Rev. A 3-2; 2 pages.

Müller, Ulrich, Deploying and Managing New Cell Sites with FRR; Apr. 4, 2015; Telcom Infra Event; <http://telecominfraonline.nl/deploying-managing-new-cell-sites/>; 21 pages.

Williams, et al. "2-Wire Virtual Remote Sensing for Voltage Regulators—Clairvoyance Marries Remote Sensing" Linear Technology Brochure, Application Note 126, Oct. 2010; www.linear.com; pp. AN126-1-AN126-22.

International Search Report and Written Opinion for PCT/US2015/013740 dated Apr. 28, 2015; 17 pages.

International Search Report and Written Opinion for PCT/US2016/022575 dated Aug. 17, 2016; 14 pages.

"Relay" from Wikipedia. Downloaded Oct. 30, 2009.

International Search Report and Written Opinion for PCT/US11/064704; dated May 16, 2012; 13 pages.

International Search Report and Written Opinion for PCT/US11/064717: dated May 16, 2012; 14 pages.

Preliminary Report on Patentablity and Written Opinion of the International Searching Authority for PCT/US2011/064704; dated Aug. 13, 2013.

Preliminary Report on Patentablity and Written Opinion of the International Searching Authority for PCT/US2011/064717; dated Aug. 13, 2013.

Partial European Search Report for EP Application No. 18742120.1 dated Sep. 4, 2020; 23 pages.

\* cited by examiner

POWER TRANSMISSION SYSTEM FOR WIRELESS COMMUNICATION SYSTEMS

The present application claims priority to U.S. Provisional Patent Application Ser. No. 62/448,637 filed on Jan. 20, 2017, titled POWER TRANSMISSION SYSTEM FOR WIRELESS COMMUNICATION SYSTEMS, which is herein incorporated by reference in its entirety.

COPYRIGHT NOTICE

A portion of the disclosure of this patent document contains material which is subject to copyright protection. The copyright owner has no objection to the facsimile reproduction by anyone of the patent document or the patent disclosure, as it appears in the United States Patent and Trademark Office patent file or records, but otherwise reserves all copyright rights whatsoever.

TECHNICAL FIELD

One or more implementations relate generally to a power transmission system for wireless communication systems.

BACKGROUND

FIG. 1 shows a power transmission system 90 used for powering remote radio heads (RRHs) 122 installed on the top of a cellular radio tower 120. The same power transmission system 90 also may be used for RRHs 122 located on building rooftops. A voltage control system 100 may include a DC power supply (DCPS) 102 that converts AC voltage from a power utility 104 into DC voltage. The DC output of DCPS 102 is connected to a DC bus 107. The same DC bus 107 also may be connected a battery bank 108 through a circuit breaker (CB) 106. CB 106 protects against short circuit conditions and a LVD (Low Voltage Disconnect) may be included in the circuit to disconnect battery bank 108 when the voltage drops below a certain voltage level, such as −42 Vdc.

Power from DC bus 107 is distributed to several DC circuits 130 (DCC1 to DCC3) that each feed a different RRH unit 122. In some cases, there might be more than 3 DC circuits, for example 12 DC circuits or even more. A base overvoltage protection (OPV) unit 110 protects voltage control system 100 from lightning events, using multiple surge protective devices (SPD) 112. A top OVP unit 124 is located at the top of tower 120 and protects RRH units 122 from lightning events. DC power jumpers 129 connect terminals on the top of OVP unit 124 for each DC circuit 130 to corresponding RRH units 122.

DCPS 102 is installed at the base of tower 120 and provides DC voltage 103 ($V_{PS}$). DCPS 102 converts the AC voltage from utility grid 104 to a DC voltage 103 of between −40 Vdc and −60 Vdc. DC voltage 103 is typically set between −53 Vdc and −55 Vdc. The exact output voltage 103 is selected based on specifications for optimum charging of batteries in battery bank 108 and type of batteries used, such as lead acid, NiCAD, etc. For some applications, the optimum operating/charging voltage of batteries 108 is around −53.5 Vdc.

The optimum operating voltage of RRHs 122 is around −54 Vdc. However, RRHs 122 have an operating voltage range from −40.5 Vdc up to −57 Vdc and in some cases can operate at up to −60 Vdc. The operating voltage for RRHs 122 can also exceed −60 Vdc for limited time periods. RRH 122 shuts down and disconnects from the input power when the input voltage drops below −40.5 Vdc or rises above −60 Vdc for a certain period of time, such as for more than a few seconds.

A voltage 128 at the input of RRH 122 ($V_{RRH}$) will be lower than voltage 103 output by DCPS 102. The difference between $V_{PS}$ and $V_{RRH}$ is equal to the voltage drop on DC cable 132, breaker, and associated jumper cables 129 that connect DCPS 102 with RRH 122. The voltage drop is dependent on the current conducted on DC cable 132 and the associated resistance of DC cable 132 (i.e. length and cross section).

In case of a power outage from utility 104, a backup generator (not shown) may provide power to voltage control system 100. In another configuration, backup power is supplied by battery bank 108 through circuit breaker 106. In the battery backup configuration, during normal operation DCPS 102 also charges battery bank 108. Breaker 106 may be integral to DCPS 102 but is shown separately in FIG. 1 for clarity.

FIG. 2 shows a battery discharge curve. The horizontal x-axis represents time, and the vertical y-axis represents voltage. Referring to FIGS. 1 and 2, battery bank 108 when fully charged by DCPS 102 may have an output voltage of −53.5 volts. Battery bank 108 may power RRHs 122 when DCPS 102 is not in operation. While powered by battery bank 108, the voltage on DC bus 107 may initially be around −53.5 Vdc when the voltage DC power supply 102 is set to operate at a normal condition. The voltage on DC bus 107 will then drop to −48 Vdc after a time period of t1 (load dependent).

The voltage from battery bank 108 will remain at approximately −48 Vdc between time t1 to time t2. Battery bank 108 is discharged at time t2 and the battery voltage falls until reaching approximately −42 Vdc at time t3. At −42 Vdc battery bank 108 disconnects from voltage control system 100. Depending on the types of batteries and power consumption, batteries 108 usually operate at −48 Vdc for 80% of their discharge time where time period t2-t1 is 80% of the total discharge time t3.

The power typically used by RRH unit 122 is around 400 watts (W). There might be several RRH units 122 on the top of tower 120 or on a rooftop each fed with an independent DC circuit 130. In some cases, one DC circuit 130 may feed more than one RRH unit 122. In this arrangement, the distribution may take place at the top of OVP 124, and the connection from the top of OVP 124 to the RRH 122 is provided through separate DC power jumpers 129.

In recent years, there has been a trend in the telecom industry to increase the power of RRH units 122 to 1200 watts (W) or higher. Since the operating voltage range remains the same for each RRH 122, the higher power loads require increased current conduction on each DC circuit 130. These higher current levels may require new larger DC power cables with much higher cross sectional areas to avoid an increased Vdrop or to comply with local codes.

The larger power cables decrease power losses. The larger power cables also reduce the voltage drop on the cable so the voltage at the top of tower 120 remains closer to the optimum operating voltage for RRH 122. The larger cables also allow battery bank 108 to operate for a longer period of time. For example, during a power loss from utility 104, the lower voltage drop allows batteries 108 to maintain the voltage level $V_{RRH}$ at the top of tower 120 above −40.5 Vdc for a longer time period. As mentioned above, the lowest operating voltage of RRH 122 is −40.5 Vdc.

However, exchanging power cables on telecommunication tower 120 or on a rooftop is difficult and also costly. The new cables will be much heavier, especially when the cables include multiple conductors feeding multiple DC circuits 130. Fiber optic (FO) and alarm cables also may need replacing when the FO and alarm cables are located within the same hybrid cables with the DC power conductors. Thus, large scale cable replacement involves significant time and cost.

Some systems overcome the voltage drop on the DC cable by increasing the voltage at the base. They use an additional full scale DC to DC converter right after DCPS 102 at the base. This DC to DC converter will dynamically convert the output voltage of DCPS 103 from −53.5 Vdc to an appropriate voltage level that will compensate the voltage drop on DC cable 132 and maintain a constant voltage level at the input of RRH 122 at the tower top, for example at −54 Vdc. In this case, the DC cable resistance is estimated.

However, full scale conversion may be very expensive and uses a very large footprint in a densified environment. Systems may estimate the resistance of the DC cables by measuring the voltage at the top of tower 120, the voltage at the base, and the conducted current. Other systems may use a capacitor attached to the RRH input 122, and transmit a specific signal to calculate the DC cable resistance when the power system is not in operation. Other systems may solely rely on the measured RRH voltage and modify the output voltage accordingly.

BRIEF DESCRIPTION OF THE DRAWINGS

The included drawings are for illustrative purposes and serve to provide examples of possible structures and operations for the disclosed inventive systems, apparatus, methods and computer-readable storage media. These drawings in no way limit any changes in form and detail that may be made by one skilled in the art without departing from the spirit and scope of the disclosed implementations.

DETAILED DESCRIPTION

A power transmission system (PTS) overcomes problems described above by increasing the output voltage of a DC-DC converter at a base location. The higher voltage decreases conducted current in DC circuits and reduces power losses in DC cables. The reduced power loss allows the PTS to transfer more power to remote radio head units without increasing the size of DC power cables. The reduced power loss also prolongs the use of battery backup and makes the PTS more efficient.

DC conductors, DC circuits, and DC cables may be used interchangeably and all refer to electrical conductors used between the DC power supply and RRH units. A voltage drop on the DC cables depends on several parameters. For example, the resistance of the conductor per DC circuit depends on the length and cross sectional area of the conductor. The PTS calculates the resistance of the DC cable and adjusts the output voltage of a DC-DC converter to compensate for a voltage drop associated with the DC cable resistance. Compensating for the voltage drop allows the PTS to operate RRHs at higher voltages without exceeding a maximum operating voltage level.

Initial measurements are taken for the voltage at the tower end of the DC cable, the voltage at the base of the tower, and the current through the DC cable. The conductor resistance is calculated for each DC cable and the voltage adjusted by the DC-DC converter so the RRH voltage does not exceed a maximum allowed input voltage. Once the conductor resistance is calculated, only the current measurement is used by the DC-DC converter to estimate the RRH input voltage. In both schemes, the output voltage of the DC-DC converter is increased statically. For example, the output voltage is adjusted to a constant voltage level based on the current configuration of the RRH, such as configured transmitted power, number of carriers, etc. The output voltage does not change during operation unless there is a configuration change, and is not constantly adjusted to maintain a constant RRH input voltage. Thus, the output voltage of the DC-DC converter will not remain constant during operation and will not be adjusted for every current variation, such as variations due to radio traffic, etc.

Figure 1:
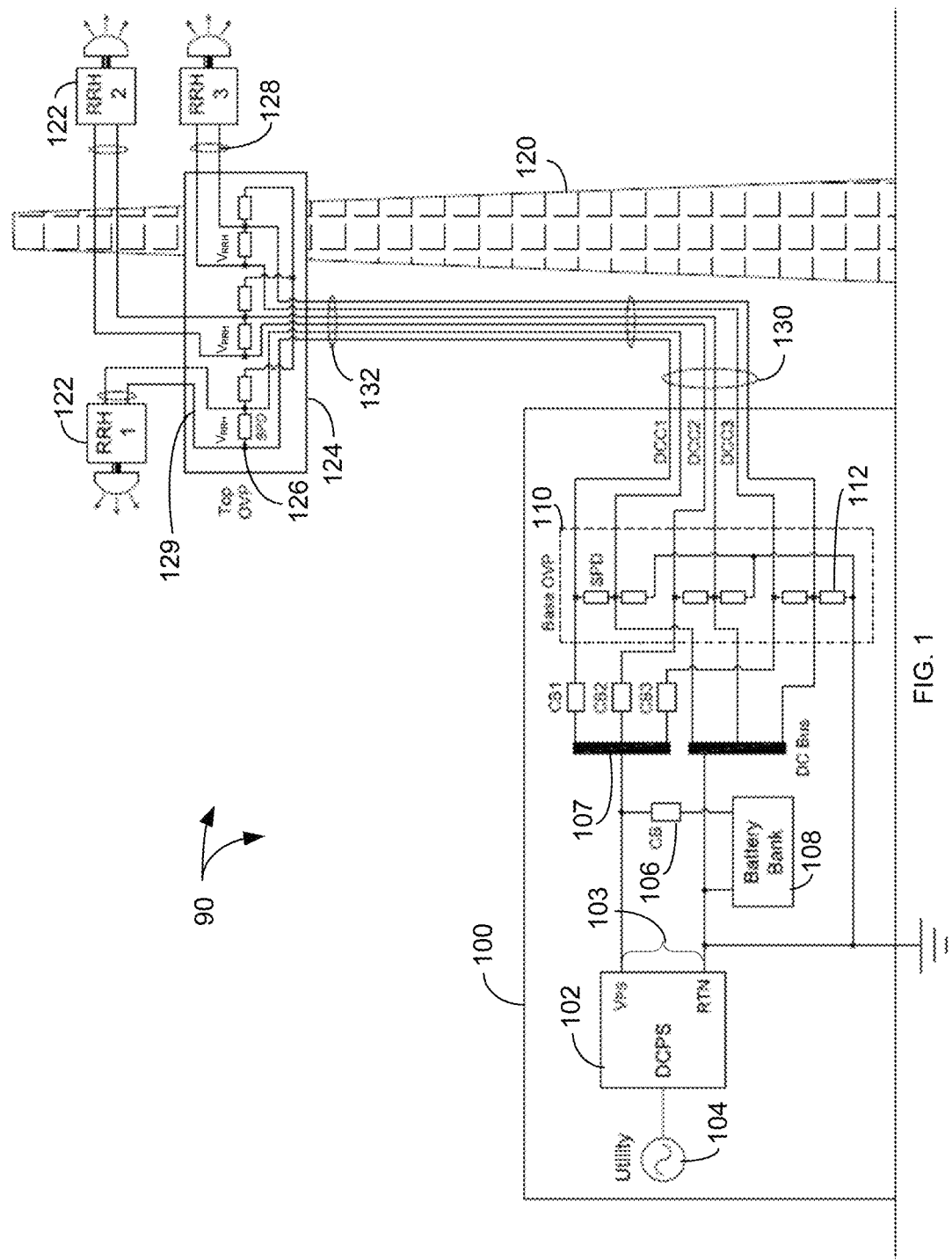
FIG. 1 shows an example power transmission system.
Figure 3A:
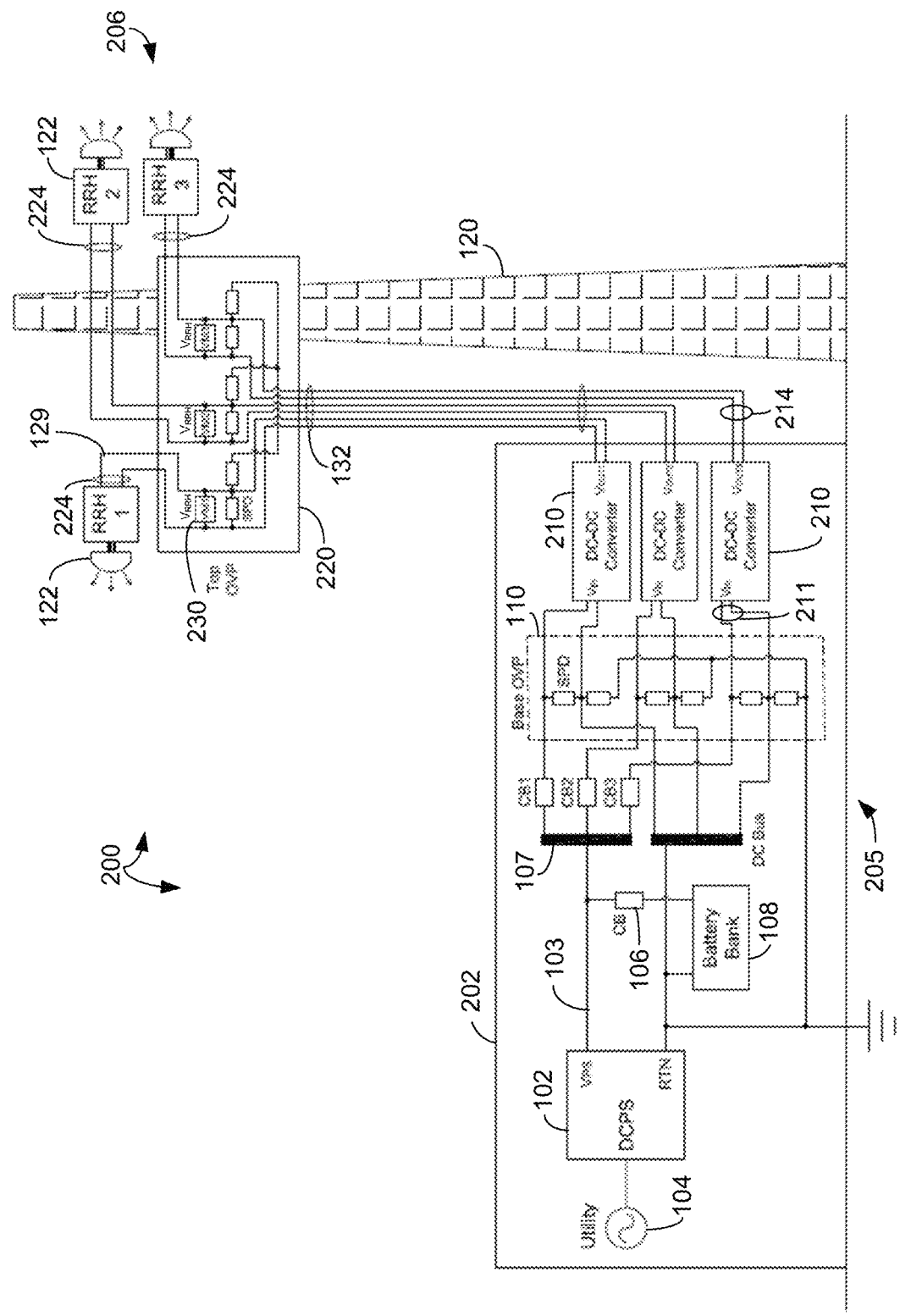
FIG. 3A shows a power transmission system that uses voltage measurement devices inside of an overvoltage protection unit to transmit current pulses identifying a voltage measurement.
Figure 3B:
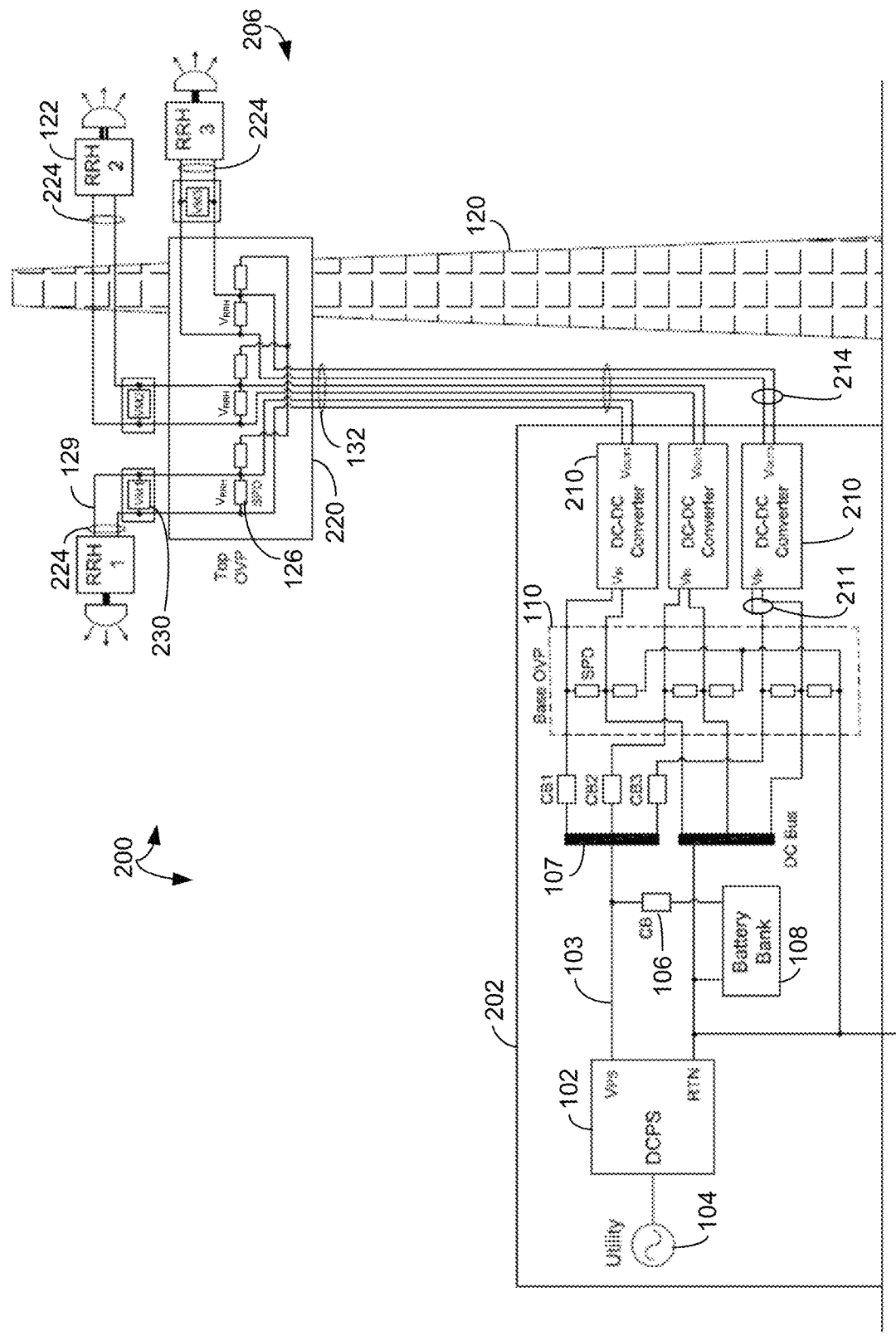
FIG. 3B shows a power transmission system that uses voltage measurement devices outside of an overvoltage protection unit to transmit current pulses identifying a voltage measurement.
Figure 3C:
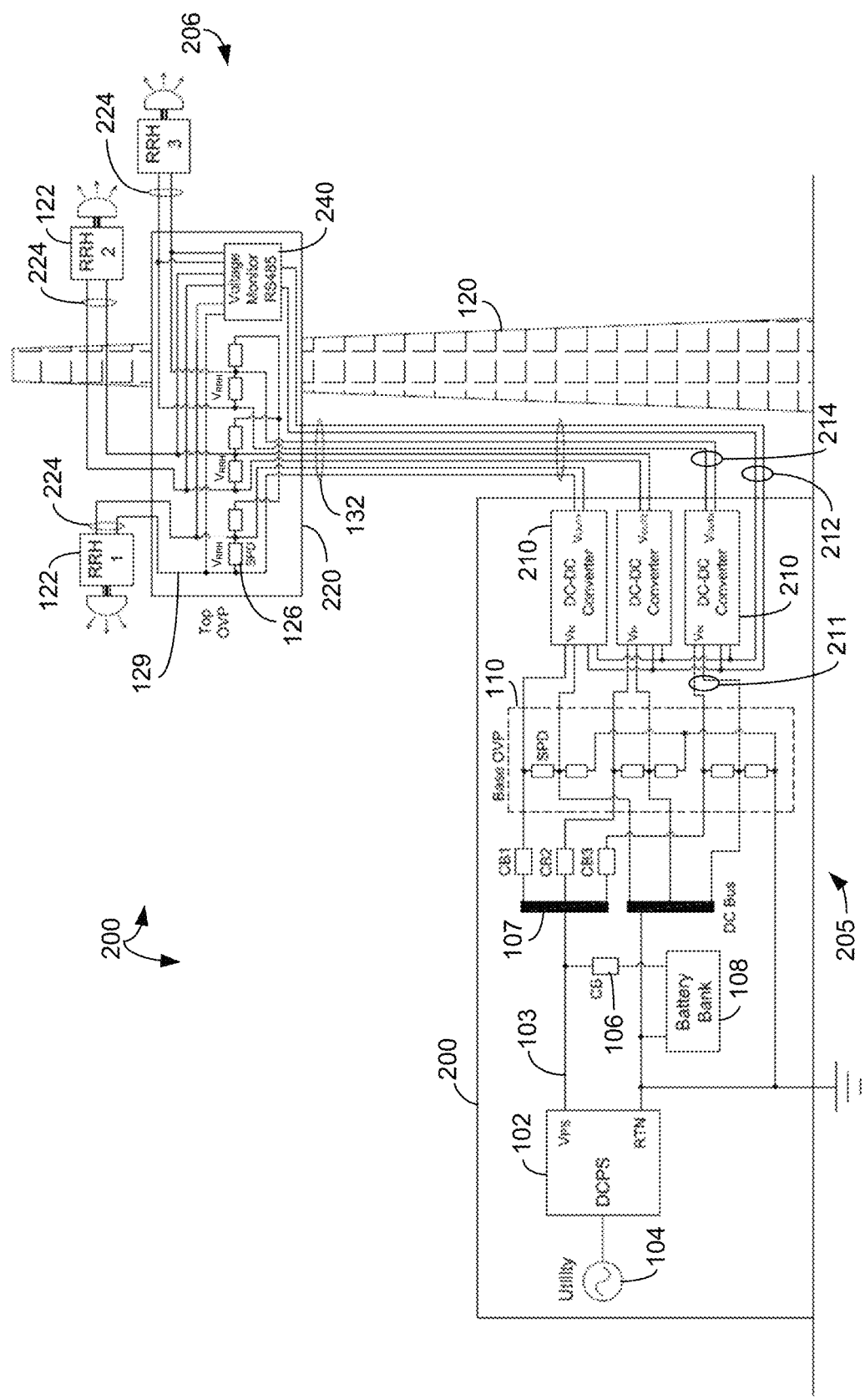
FIG. 3C shows a power transmission system that uses a voltage measurement device to transmit a measured voltage over a communication link.

FIGS. 3A-3C show a power transmission system 200 that scales up the output voltage from a voltage control system 202 based on an estimated resistance of power cable 132. Some components in FIGS. 3A-3C are similar to components shown above in FIG. 1. Other components in FIGS. 3A-3C are described in more detail below.

The description below refers to a base location 205 and a top location 206. Base location 205 refers to any location where voltage control system 202 is located and connected to a base end of DC cable 132. In one example, base location 205 is at the base of tower 120 or in a building that also contains a base band unit (BBU). Top location 206 is any location where RRHs 122 are located and connected to a second top end of DC cables 132. In one example, top location 206 is on top of a tower 120 or on a roof top.

Voltage control system 202 includes one or more DC-DC converters 210 that are coupled at inputs 211 ($V_{IN}$) to DC buses 107 (via breakers) and coupled at outputs 214 ($V_{OUT}$) to the base end of DC cables 132. In FIG. 3A, one or more voltage monitoring (VM) devices 230 are installed inside of top over voltage protection (OVP) system 220 and are coupled to the top end of DC cables 132. In FIG. 3B, one or more VM devices 230 are coupled the top end of DC cables 132 as part of DC power jumper cables 129 that connect OVP 220 to RRHs 122. In FIG. 3C, VM device 240 is coupled to the top ends of one or more DC cables 132.

VM devices 230 in FIGS. 3A and 3B measure voltage 224 ($V_{RRH}$) at top location 206 and communicate with DC-DC converter 210 at base location 205 by sending current pulses over DC power cables 132. VM device 240 in FIG. 3C measures all voltages 224 at the top of tower 120 and transmits the measured voltages to DC-DC converter 210 through a communication link 212, such as a RS485 communication link. VM device 240 may use other types of communication links, such as optical fiber lines.

DC-DC converter 210 may add voltage levels to input voltage 211 so voltage 224 at top location 206 is within the optimum RRH operating voltage range of around −54 Vdc to −56 VDC. DC-DC converter 210 also keeps voltage 224 below a maximum operating voltage that could cause RRH 122 to shut down. Also, during start up, if the input voltage of the DC-DC converter is below a certain threshold (say −53 Vdc), then the output voltage of the DC-DC converter could be set to −53 Vdc to ensure proper start up of the RRH in case the system runs on batteries during the start up and the voltage level of the batteries is below −50 Vdc. Voltage 224 depends on the voltage drop on DC cable 132. The voltage drop depends on the length and cross section area of DC cable 132, and also depends on the conducted current through DC cable 132 which depends on the power consumption of RRH 122. DC-DC converter 210 calculates the resistance of power cable 132, estimates the voltage drop on power cable 132, and modifies output voltage 214 to compensate for the Vdrop.

Figure 4:
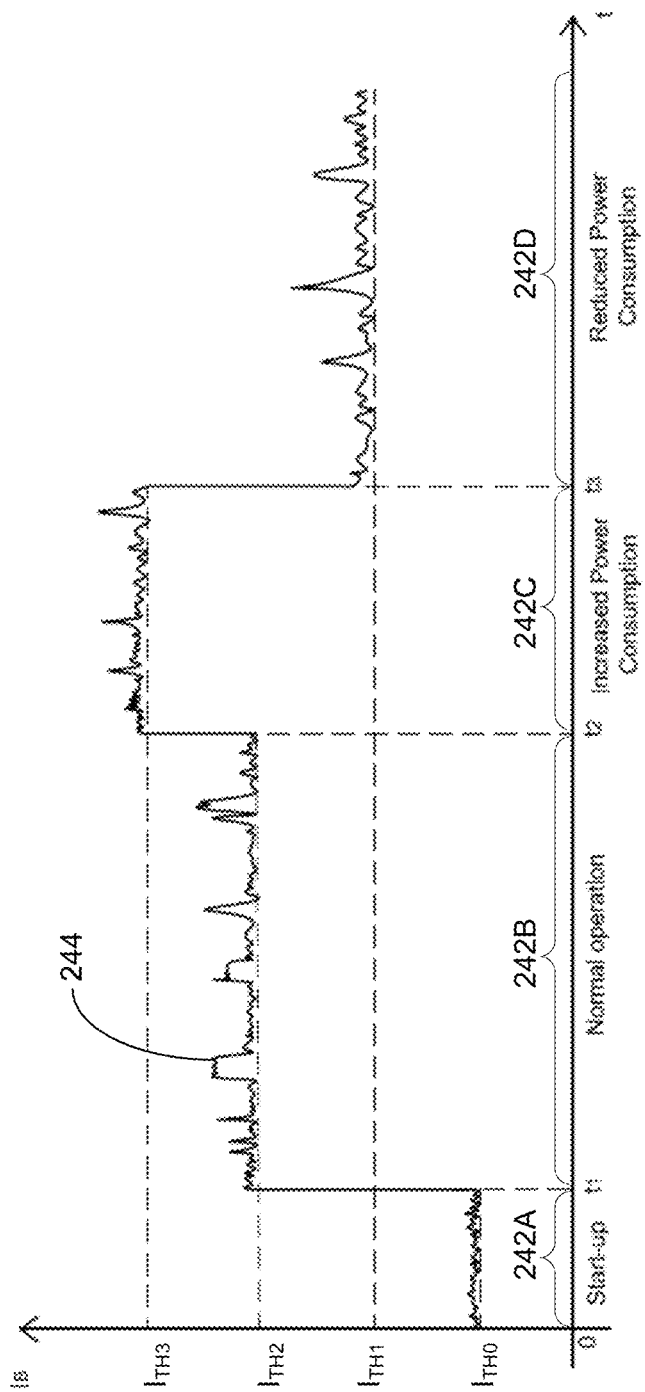
FIG. 4 shows different threshold currents for a remote radio head (RRH).

FIG. 4 shows a current conduction profile for RRH 122. A horizontal x-axis represents time and a vertical y-axis represents current $I_B$ conducted by RRH 122 during different operating stages. Current $I_B$ affects the voltage drop on DC cable 132.

During a start-up stage 242A, RRH 122 performs boot-up operations and powers up electronic components. Start-up stage 242A has a relatively low power consumption threshold current load $I_{TH0}$ of between 1-2 amps (A) and a usual start-up time (t1) between 20 seconds up to around 2 minutes.

During a normal operation stage 242B, a radio frequency (RF) output of RRH 122 is enabled for performing wireless data transmissions. During normal operation stage 242B, current $I_B$ may fluctuate between a minimum threshold current value $I_{TH2}$ and a few amps (1-3 A) above $I_{TH2}$. The current fluctuation is due to transmission traffic and other operational state variations. RRH 122 might remain in normal operation mode 242B for months or years without any substantial change to $I_{TH2}$.

RRH 122 may be reconfigured to operate in an increased power consumption mode 242C. For example, a technician may reconfigure RRH 122 to transmit a larger number of data carriers or transmit with increased output power, etc. In one example, the technician may reconfigure RRH 122 remotely from a central office when RRH 122 is under normal operation stage 242B. During increased power consumption stage 242C, RRH 122 operates at an increased threshold current value $I_{TH3}$ and current $I_B$ may again fluctuate between 1-3 A above $I_{TH3}$.

A technician also may reconfigure RRH 122 to operate at a reduced power operating stage 242D with a threshold current $I_{TH1}$ below threshold current $I_{TH2}$ for normal operating stage 242B. In all four operating stages 242, RRH 122 maintains a static threshold current $I_{TH}$. RRH 122 is rarely reconfigured to operate in different stages 242 and therefore $I_{TH}$ rarely changes.

However, when RRH 122 is reconfigured, any associated reduction in $I_{TH}$ also reduces the voltage drop on DC cable 132 and increases the voltage 224 at the input of RRH 122. Any associated increase in $I_{TH}$ increases the voltage drop on DC cable 132 and decreases voltage 224 at the input of RRH 122. DC-DC converter 210 estimates the voltage drop on power cable 132 for these different RRH operating stages 242 so an optimal voltage 224 can be used for powering RRH 122.

Figure 5A:
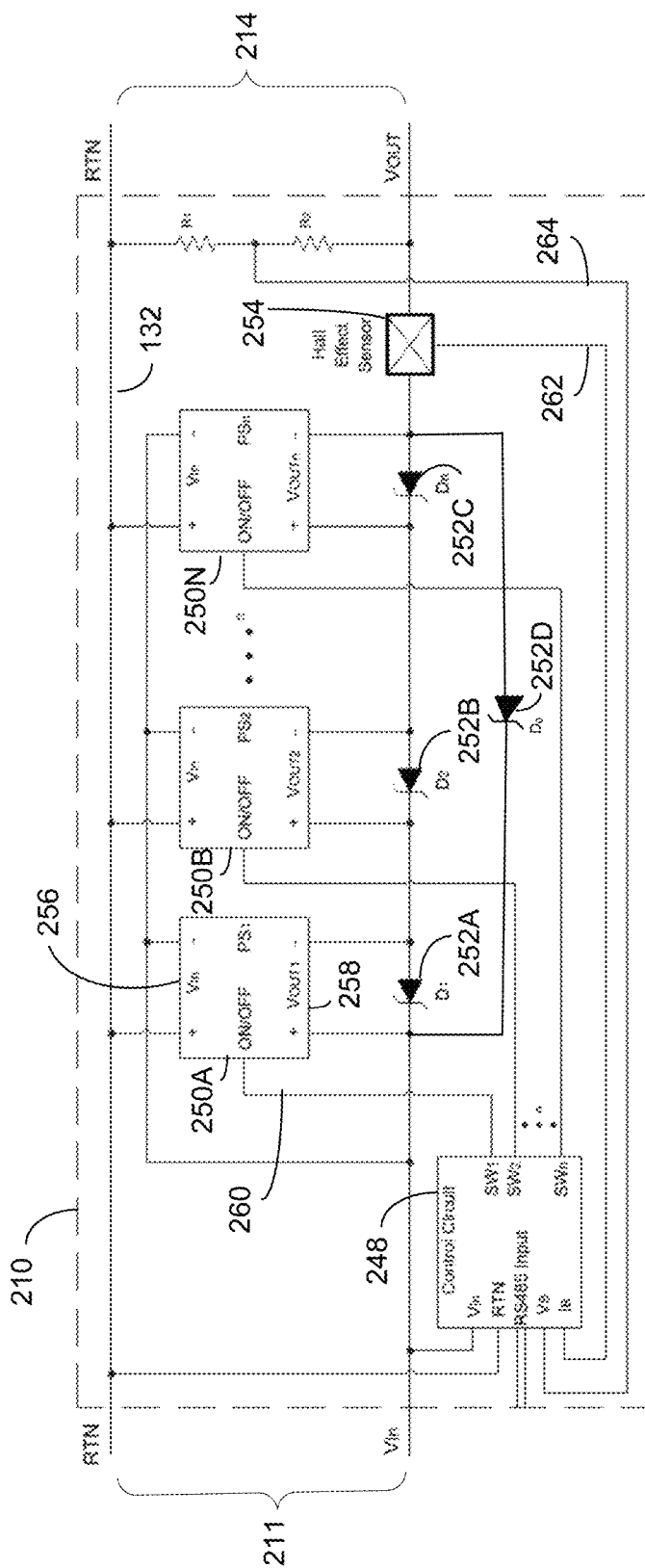
FIG. 5A shows a diode based DC-DC converter used in the power transmission system.

FIG. 5A shows DC-DC converter 210 in more detail. Converter 210 is a two-port device, with input voltage 211 on DC bus 107 from power system 102 typically at −53.5 Vdc. Single or multiple DC-DC converter modules 250A-250N each may include an input 256 that varies from −37 Vdc up to −60 Vdc and an output 258 that generates a fixed or variable output voltage. For example, converter modules 250 may generate output voltages 258 of −3.3 VDC, −5 Vdc, or −12 Vdc, etc. In some implementations, only one converter module 250 is used with a same voltage input range and an output voltage 258 varying between −0.5 Vdc to −13.2 Vdc. Output voltages 258 can be adjusted by a voltage control signal 260 from control circuit 248.

Each converter module 250 is selectively activated by control circuit 248 via ON/OFF input 260. When converter module 250 is not activated, an associated diode (or FET) 252 passes $V_{IN}$ input 211 to $V_{OUT}$ output 214. Thus, DC-DC converter 210 has the advantage of passing the voltage from input 211 to output 214 even when converter modules 250 are non-operational. DC-DC converter 210 also has the advantage of simply adding voltage levels to $V_{IN}$ instead of generating an independently generated boost output voltage. Thus, DC-DC converter 210 is less complex, uses a smaller footprint and has increased efficiency compared to an equivalent full-scale DC-DC converter.

In one state, all modules 250A-N are off. In order to avoid the voltage drop between $V_{in}$ and $V_{out}$ from diodes 252A-252C, a bypass diode 252D ($D_0$) is connected between the cathode of diode 252A and the anode of diode 252C.

Figure 5B:
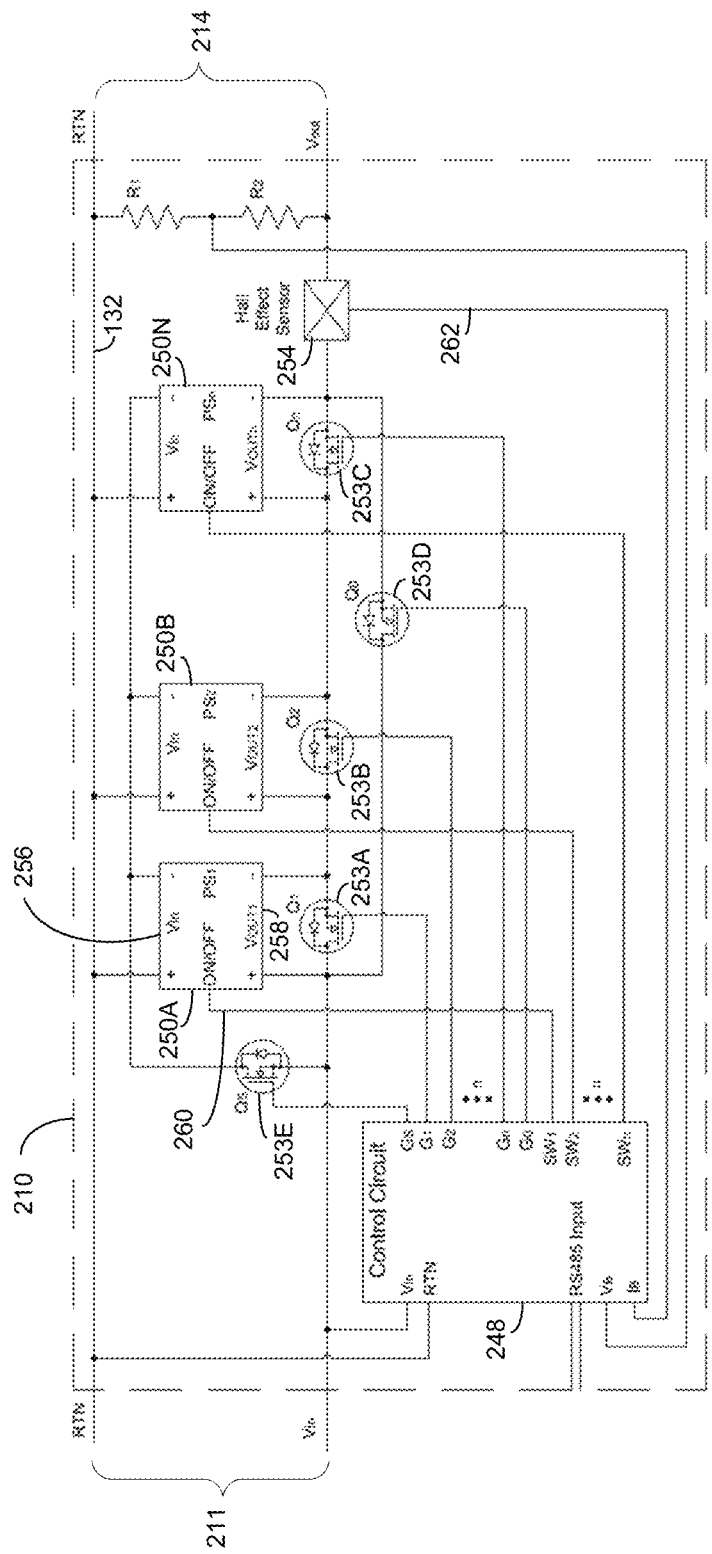
FIG. 5B shows a transistor based DC-DC converter used in the power transmission system.

FIG. 5B shows an alternative configuration for DC-DC converter 210. Diodes 252A-252D in FIG. 5A may be replaced with metal-oxide semiconductor field effect transistor (MOSFET) switches 253A-253D, respectively. MOSFET switches 253 reduce the voltage drop compared with diodes 252 in FIG. 5A. When any of modules 250 are off, the corresponding MOSFET switch 253 is turned on. Switch 253D is turned off when at least one module 250 is turned on and switch 253D is turned on when all modules 250 are turned off.

A MOSFET switch 253E is turned off by control circuit 248 when an overvoltage condition is detected on input voltage 211. For example, control circuit 248 may detect a power surge on input voltage 211 caused for example by a lighting strike. There are two independent high speed driving circuits in control circuit 248 that turn on (close) MOSFET 253D and simultaneously turn off (open) MOSFET 253E. In one example, if input voltage 211 exceeds 80 Volts, control circuit 248 turns on MOSFET 253D shorting the output of DC/DC converters 210. The surge current flows through MOSFET 253D protecting the outputs of DC/DC converter 210. At the same time MOSFET 253E is turned off preventing surge current from passing through inputs 256 of converter modules 250.

Output voltage 214 for DC-DC converter 210 will be:

$$V_{OUT}=V_{IN}+\Sigma_{i=1}^{n}V_{OUTi} \quad (1)$$

Assume an input voltage $V_{IN}$ of −53.5 Vdc and two converter modules 250A and 250B with Vout1=−3.3 Vdc and Vout2=−5 Vdc, respectively. DC-DC converter 210 may produce different voltage values on output 214 depending on which converter modules 250A and 250B are activated. For example, output voltage 214 would be −56.8 Vdc when converter module 250A is activated, −58.5 Vdc when converter module 250B is activated, and −61.8 Vdc when converter modules 250A and 250B are activated.

Figure 6:
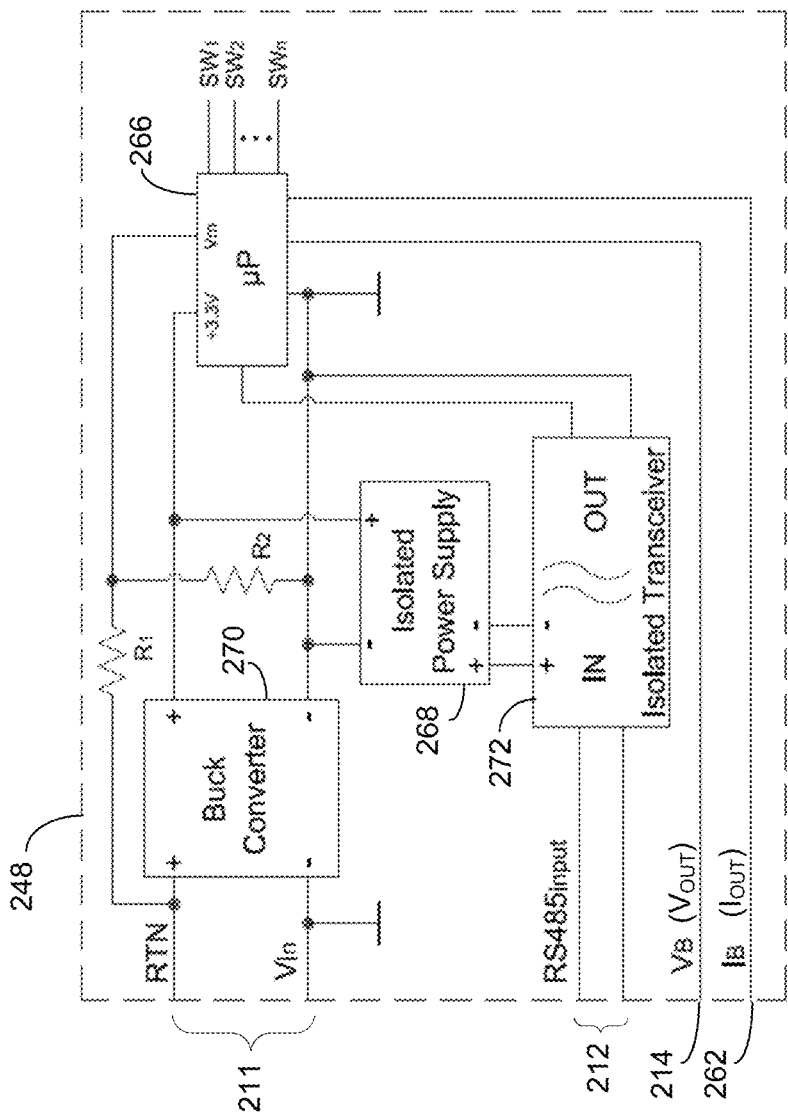
FIG. 6 shows a control circuit used in the DC-DC converter of FIGS. 5A and 5B.

FIG. 6 shows control circuit 248 used in DC-DC converter 210 in more detail. A buck converter 270 converts input voltage 211 to 3.3 v for operating a microprocessor 266. An isolated power supply 268 generates power for operating a transceiver 272. Transceiver 272 receives data on RS485 communication link 212 and sends the data to microprocessor 266. If PTS 200 is configured according to FIG. 3C, RS485 link 212 may provide voltage measurements 224 from VM device 240 at the top of tower 120. If PTS 200 is configured as shown in FIG. 3A or 3B, RS485 link 212 might not be used.

Microprocessor 266 controls which converter modules 250 are enabled and disabled based on the estimated resistance of DC cable 132 and the current level $I_B$ measured by hall effect sensor 254 (FIGS. 5A and 5B) at the output of DC-DC converter 210. There are two types of analog Hall Effect sensors which may perform the current measurement. In the first current sensor type the current passing through the sensing device and the analog Hall Sensor is integrated inside the sensing device. An example of this type of current sensor is the ACS723 from ALLEGRO MICROSYSTEMS LLC manufacturer. The second current sensor type the analog Hall Sensor is located close to the cable but is isolated. An example of this type of current sensor is the A1366LKTTN from ALLEGRO MICROSYSTEMS LLC manufacturer. The microprocessor periodicity verifies the calculated resistance value.

Figure 7:
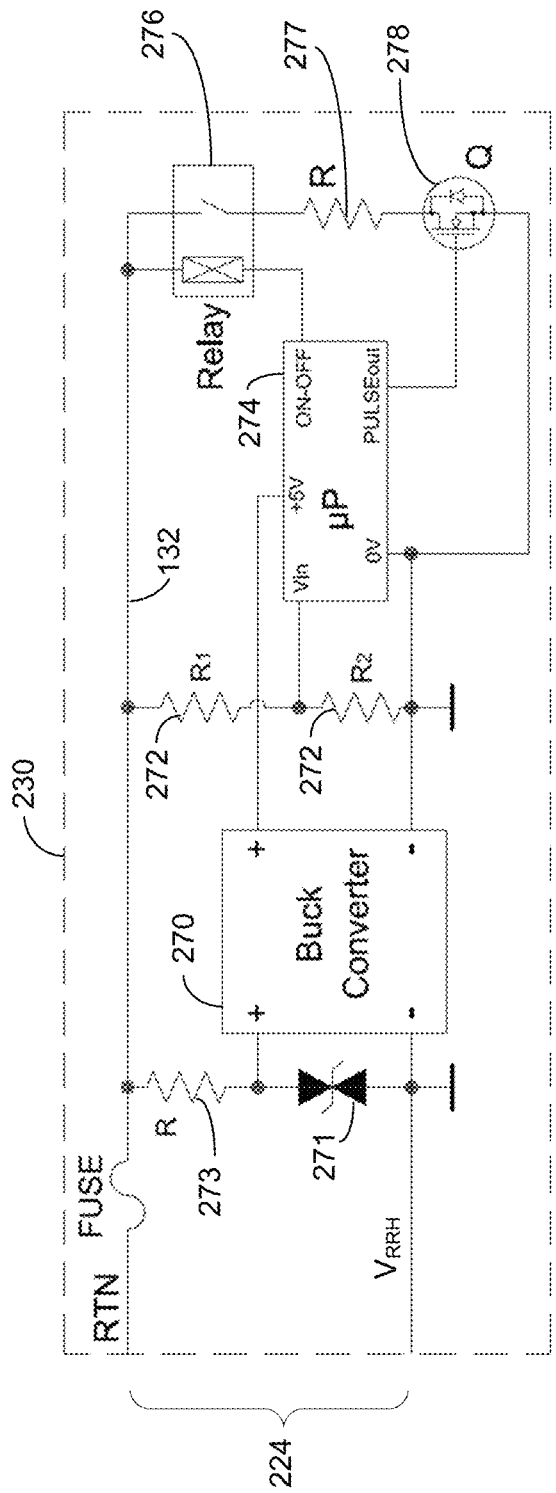
FIG. 7 shows an example voltage measurement device used in the power transmission systems of FIGS. 3A and 3B.

FIG. 7 shows voltage monitor 230 from FIGS. 3A and 3B in more detail. Referring to FIGS. 3A, 3B, 5A, 5B, 6, and 7, DC-DC converter 210 generates a pulse on output 214 with a step magnitude and duration suitable to transmit and receive the voltage data. For example, DC-DC converter 210 may activate one of converter modules 250 that adds 3.3 Vdc to $V_{IN}$ for at least 10 ms. In response to detecting the voltage pulse on the DC cable, microprocessor 274 in VM device 230 measures voltage 224 at the top of tower 120 through a voltage divider 272. At the same time, microprocessor 266 in DC-DC converter 210 measures voltage 264 and current 262 at base 205.

Microprocessor 274 in voltage monitor 230 transmits the measured voltage 224 to DC-DC converter 210 for a fixed period of time, such as 50 ms. The value of voltage 224 is transmitted using current pulses that are detected by hall affect sensor 254 in DC-DC converter 210. The digital current pulses are generated by switching on and off a resistance 277 in VM device 230 using a MOSFET transistor 278.

A relay 276 physically disconnects resistance 277 when there are no digital pulse transmissions. This protects MOSFET 278 during lightning and other power surge events. A transient-voltage-suppressor (TVS) 271 is connected in series with a resistor 273 to protect voltage monitoring device 230 during a surge/lightning event. During the surge event, resistor 273 and TVS 271 short a limited current across input 224.

Figure 14:
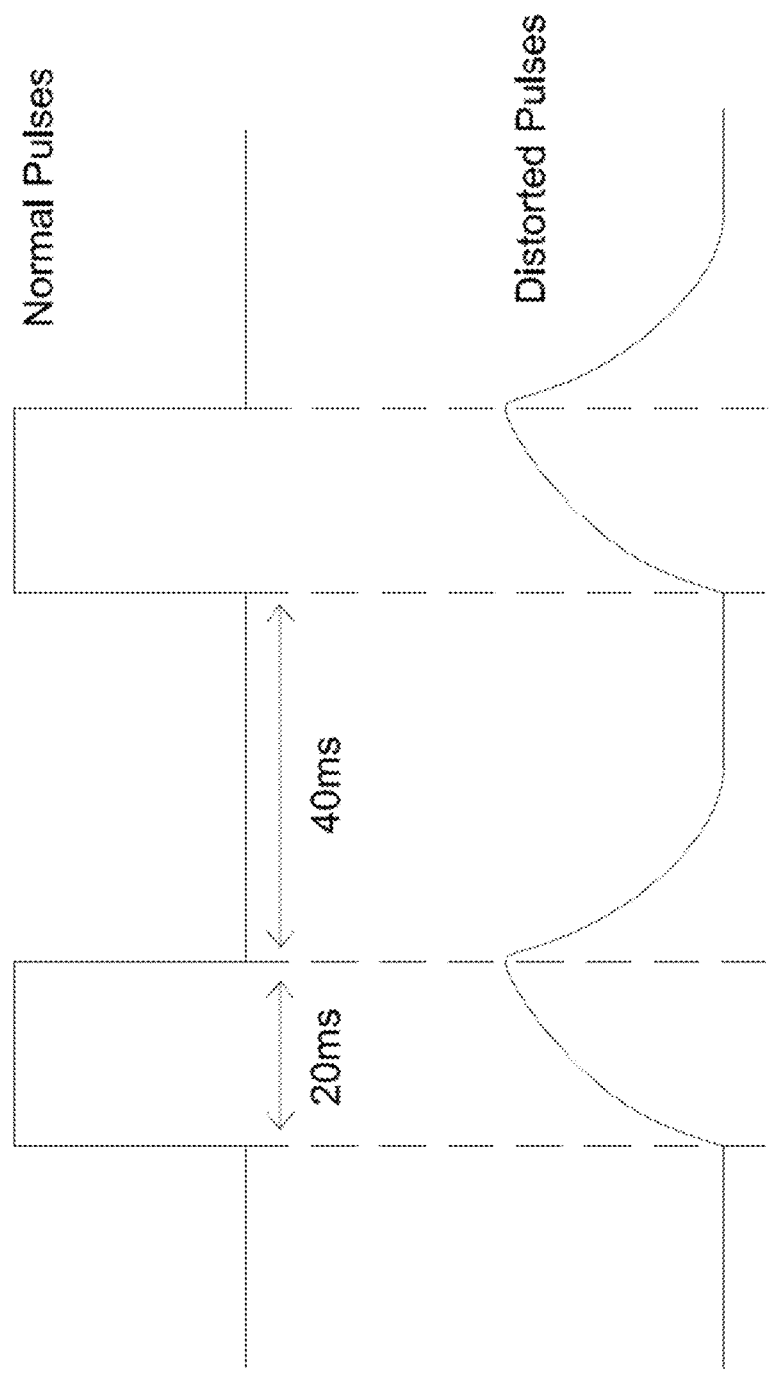
FIG. 14 shows a current pulse waveform and a distorted current pulse waveform under high capacitance and high inductance line conditions.

The transmitted current pulses may change the current conduction detected by hall-effect sensor 254 between 0.5-2 A and ideally around 1 A. Microprocessor 266 (FIG. 6). The control circuit 248 translates the current pulses sensed on DC cable 132 into the value for voltage 224 at top location 206. The width of the current pulses are 20 msec with a 40 msec gap between them. This gap is necessary to separate the pulses in the case of high system capacitance and inductance and also due to the non-linear behavior of the RRH load. In this case the pulses are distorted as FIG. 14 shows. The software detects the distorted current pulses from their integration over time. The current pulses might be transmitted before the RF transmission of the RRH 122 because of the current conflicts.

Figure 8:
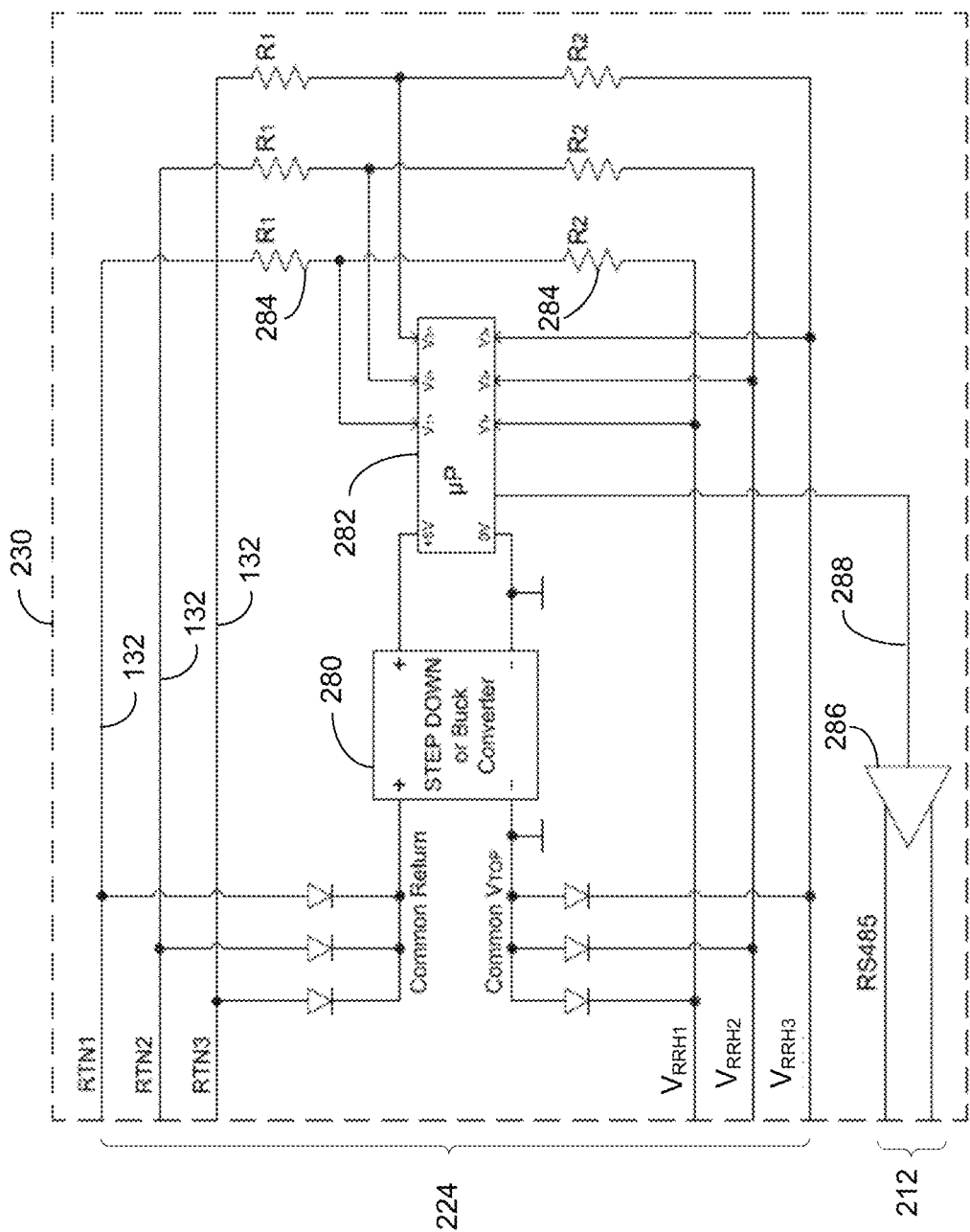
FIG. 8 shows an example voltage measurement device used in the power transmission system of FIG. 3C.

FIG. 8 shows VM device 240 used in the power transmission system of FIG. 3C in more detail. RRH voltages 224 at the inputs of RRHs 122 are connected to a step down or buck converter 280 that generates 5 volts for powering a microprocessor 282. Voltage divider circuits 284 scale RRH voltages 224 measured by microprocessor 282.

Microprocessor 282 continuously monitors RRH voltage 224 for each DC cable at the top of tower 120 and converts the measured RRH voltages 224 into digital values output on line 288. A driver 286 transmits the digital RRH voltages 224 back to DC-DC converter 210 over RS485 communication link 212.

Referring back to FIG. 5A or 5B, DC-DC converter 210 calculates the resistance $R_{CABLE}$ of each DC cable 132 based on output voltage 214, output current 262 measured at the base end of DC cable 132, and RRH voltage 224 measured by voltage monitor 230 or 240 at the top end of DC cable 132. All parameters are measured at substantially the same time. There might be a latency in data transmission which is constant, therefore it can be estimated and compensated, so that all measurements are taken at the same time instance. Output voltage 214 generated by DC-DC converter 210 at the base of DC cable 132 is referred to as either $V_{OUT}$ or $V_B$. Current 262 measured by DC-DC converter 210 at the base of DC cable 132 is referred to as either $I_{OUT}$ or $I_B$.

Figure 9:
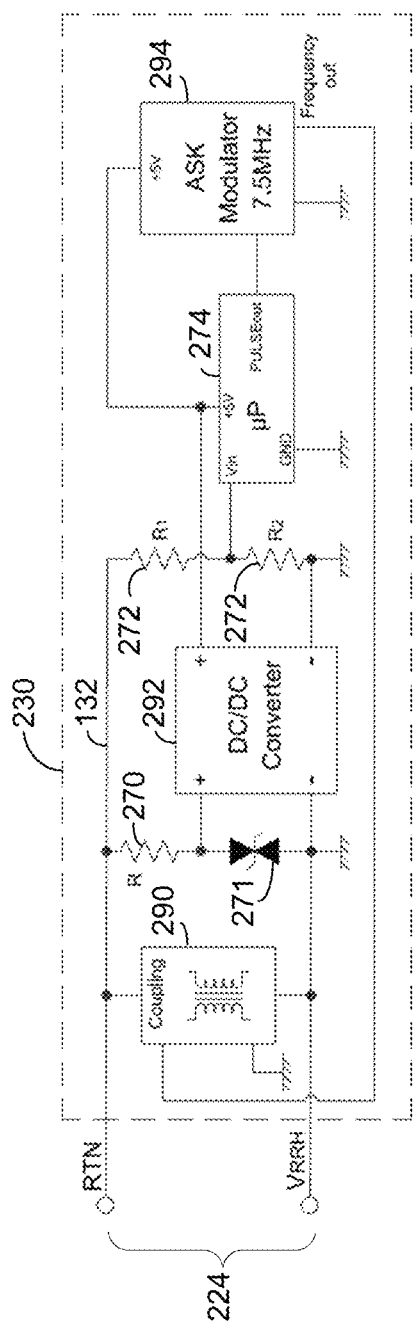
FIG. 9 shows an example voltage measurement device that uses amplitude shift keying (ASK) to send voltage measurement values to a DC-DC converter.
Figure 10:
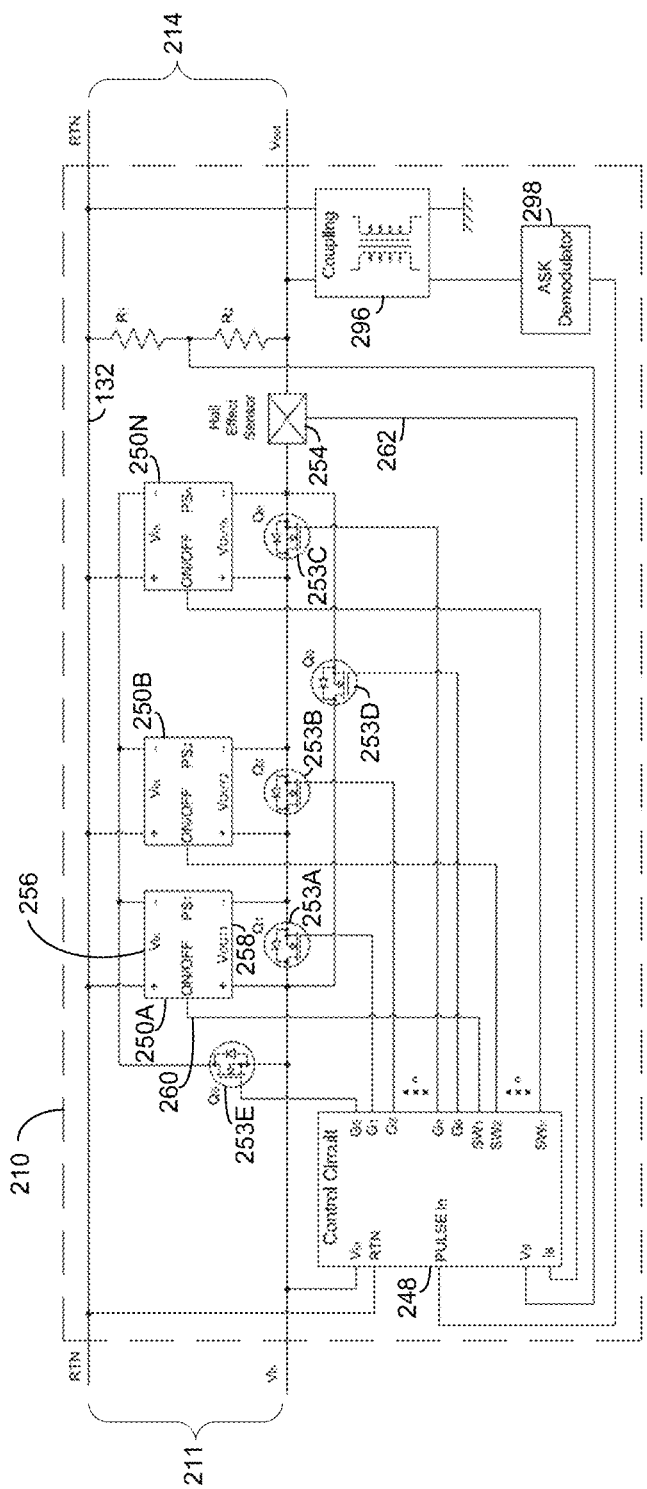
FIG. 10 shows an example DC-DC converter that demodulates ASK signals received from the voltage measurement device in FIG. 9.

FIGS. 9 and 10 show an alternative configuration for transmitting voltage measurements from the voltage monitoring device 230 at the top of tower 120 to DC-DC converter 210 at the base of tower 120. FIG. 9 shows an alternative configuration of voltage monitoring device 230 in FIG. 7 and FIG. 10 shows an alternative configuration of DC-DC converter 210 in FIG. 5B.

Referring first to FIG. 9, voltage divider 272 inputs a scaled voltage 224 to microprocessor 274 as described above in FIG. 7. A DC/DC converter 292 converts voltage 224 into a 5 volt DC power supply for powering microprocessor 274 similar to buck converter 270 in FIG. 7. Microprocessor 274 generates pulses that turn on amplitude shift keying (ASK) modulator 294. In one example modulator 294 may operate at a frequency of around 7.5 megahertz (MHz). The output of modulator 294 is connected to a coupling transformer 290 that injects the 5 volt 7.5 MHz pulses into power cable 132 without using a galvanic connection.

Referring to FIG. 10, DC-DC converter 210 includes a coupling transformer 296 to the base end of power cable 132. Transformer 296 detects the 7.5 MHz A.C. pulses transmitted by voltage monitor 230. An ASK demodulator 298 demodulates the pulses from the 7.5 MHz signal and sends the pulses to microprocessor 248. Microprocessor 274 in voltage monitor 230 encodes a series of the 7.5 MHz pulses to indicate a particular voltage value. Microprocessor 248 decodes the series of pulses received from demodulator 298 back into the voltage value measured by voltage monitor 230. The 7.5 MHz voltage pulses are unaffected by the current variations due to RF transmission and also are almost unaffected by the capacitance or inductance of the DC power cables 132, RRH 122 and DCPS 102. Thus the 7.5 MHz voltage pulses can be transmitted even during the RF transmission of the RRH 122.

Selecting Output Voltage of DC-DC Converter

DC-DC converter 210 may calculate the resistance of DC cable 132 using the following formula:

$$R_{CABLE} = (V_{OUT} - V_{RRH})/I_{OUT} \qquad (2),$$

where $I_{OUT}$ is the current conducted through power cable 132 measured by hall effect sensor 254, $V_{OUT}$ is the DC-DC converter output voltage 214, and $V_{RRH}$ is voltage 224 measured at the input of RRH 122.

PTS 200 may measure the voltage levels and calculate the associated resistance for each DC cable 132 connected to an RRH 122. The voltage levels and current levels and associated DC cable resistance may be calculated when there is a change in the RRH operating stages described above in FIG. 4. For example, DC-DC converter 210 may measure $V_{OUT}$ and $V_{RRH}$ during start-up stage 242A in FIG. 4. Current in DC cable 132 may be stable during start-up stage 242A since there are no RF transmissions by RRH 122 and any power consumption is limited to a substantially fixed level for booting RRH electronics.

The time duration when the voltage measurements are taken may be relatively small when the power consumption is stable over this small period of time. In this case, the voltage measurements for estimating the $R_{CABLE}$ could also be calculated during normal operations stage 242B in FIG. 4.

One reason to perform the voltage and current measurements during start-up stage 242A, is to determine the proper voltage output 214 for DC-DC converter 210 before RRH 122 starts RF transmissions. For example, if during start up the system runs on batteries and the output voltage of the batteries is very low (below −50 Vdc), then the output voltage of the DC-DC converter could be raised to −53 Vdc to ensure proper start up and initialization of the RRH (as the input voltage of the RRH has to be above −40.5 Vdc). RRH 122 will have increased power consumption during RF transmissions and higher output voltage 214 may be required at base 205.

The conducted current $I_{OUT}$ in DC cable 132 has a significant influence on the selected voltage at base 205. As mentioned above, when current conduction increases, the voltage drop on DC cable 132 also increases and DC-DC converter 210 may need to generate a higher output voltage 214. When the current conduction decreases, DC-DC converter 210 may need to decrease output voltage 214 to avoid voltage 224 exceeding the maximum operating level of RRH 122.

DC-DC converter 210 calculates voltage 224 at the input of RRH 122 using the following formula, given that the resistance of DC cable 132 has been previously estimated as described above.

$$V_{RRH} = V_{OUT} - I_{OUT} R_{CABLE} \qquad (3),$$

where $I_{OUT}$ is the current conduction in DC cable 132, $R_{CABLE}$ is the resistance of DC cable 132, $V_{OUT}$ is output voltage 214 of DC-DC converter 210, and $V_{RRH}$ is the measured input voltage 224 at RRH 122.

As shown above in FIG. 4, current $I_{OUT}$ may change during different operating modes. During start-up stage 242A, $I_{OUT}$ used by RRH 122 is relatively low and stable. DC-DC converter 210 may not need to increase output voltage 214 since $I_{OUT}$ and the associated cable voltage drop is small.

Current $I_{OUT}$ increases significantly when RRH 122 starts RF transmissions during normal operation stage 242B in FIG. 4. However, current $I_{OUT}$ remains above current threshold level $I_{TH2}$. The current variations 244 are usually due to changes in the amount of data transmitted by RRH 122, and may vary between threshold current level $I_{TH2}$ and up to 50% above this level.

The threshold current levels $I_{TH}$ for RRH 122 depend on the transmission settings, such as configuration settings specifying the number of data carriers, the output RF transmission power level (from 10 W up to 80 W), etc. Thus, the settings and associated current thresholds $I_{TH}$ are relatively stable (static) during operation of RRH 122 and may not significantly change with time, unless reconfigured by an operator.

Based on the above, the RRH start up stage, normal operation stage, increases in current threshold level, and decreases in current threshold level may be taken into account when selecting the appropriate output voltage 214 for DC-DC converter 210.

The control circuit 248 continuously monitors conducted current $I_{OUT}$ for any changes in current threshold $I_{TH}$. The response time to detect a change in current threshold $I_{TH}$ could be around 4 sec. In this 4 sec period the control circuit takes the current average of 4000 current measurements. During start-up stage 242A, the control circuit 248 may measure DC cable resistance $R_{CABLE}$ and might not increase output voltage 214.

During normal operation stage 242B, RRH 122 may start RF transmissions. The control circuit 248 may calculate $I_{TH}$ within a period of up to 16 min and then set output voltage 214 to the maximum allowable output voltage step for the calculated $I_{TH}$.

For example, DC-DC converter 210 may generate output voltages 214 of −56.8 Vdc, −58.5 Vdc, and −61.8 Vdc. Microprocessor 266 uses equation 3 above to ensure $V_{RRH}$ at the input of RRH 122 does not exceed a maximum operating voltage of −57 Vdc. For example, after calculating $R_{CABLE}$ and $I_{OUT}$, microprocessor 266 may set the highest possible output voltage $V_{OUT}$ where $V_{RRH}$ still remains under −57 Vdc. In some implementations, the output voltage of DC-DC converter 210 might take any level between Vin −0.5 Vdc and Vin −13.2 Vdc, when a converter module 250 with adjustable voltage output is used.

Output voltage $V_{OUT}$ of DC-DC converter 210 may remain at that voltage level until a change is detected in $I_{TH}$. For example, microprocessor 266 in the control circuit 248 may detect an increase in $I_{OUT}$ greater than 10%. In this case, microprocessor 266 may calculate a new current threshold $I_{TH}$ over a 16 min time period. After the new current threshold is calculated, microprocessor 266 may determine if $V_{OUT}$ can be further increased.

The control circuit 248 also may detect a decrease in the current threshold level $I_{TH}$. Microprocessor 266 may estimate a new current threshold $I_{TH}$ and then reduce the output voltage level if required. There might be cases where the current conduction drops significantly. In these cases, $V_{RRH}$ could exceed the −57 Vdc maximum operating voltage of RRH 122. DC-DC converter 210 may immediately reduce $V_{OUT}$ to the next available level below the current voltage level. DC-DC converter 210 may reduce $V_{OUT}$ based on a last measured current value and not wait for the calculation of the new current threshold level $I_{TH}$.

To explain further, depending on data transmission traffic, under normal operation $I_{OUT}$ may always be above $I_{TH}$. However, any current measurement more than 10% below $I_{TH}$ is likely due to a change in the set-up configuration for RRH 122. During RRH reconfiguration, the control circuit 248 reacts rapidly in a case of extreme high or extreme low $V_{RRH}$ values. Therefore, DC-DC converter 210 immediately modifies $V_{OUT}$ to prevent $V_{RRH}$ from exceeding the nominal operating voltage. As soon as $I_{OUT}$ stabilizes, and a new $I_{TH}$ is estimated, DC-DC converter 210 may select a new $V_{OUT}$ based on equation 3.

Figure 2:
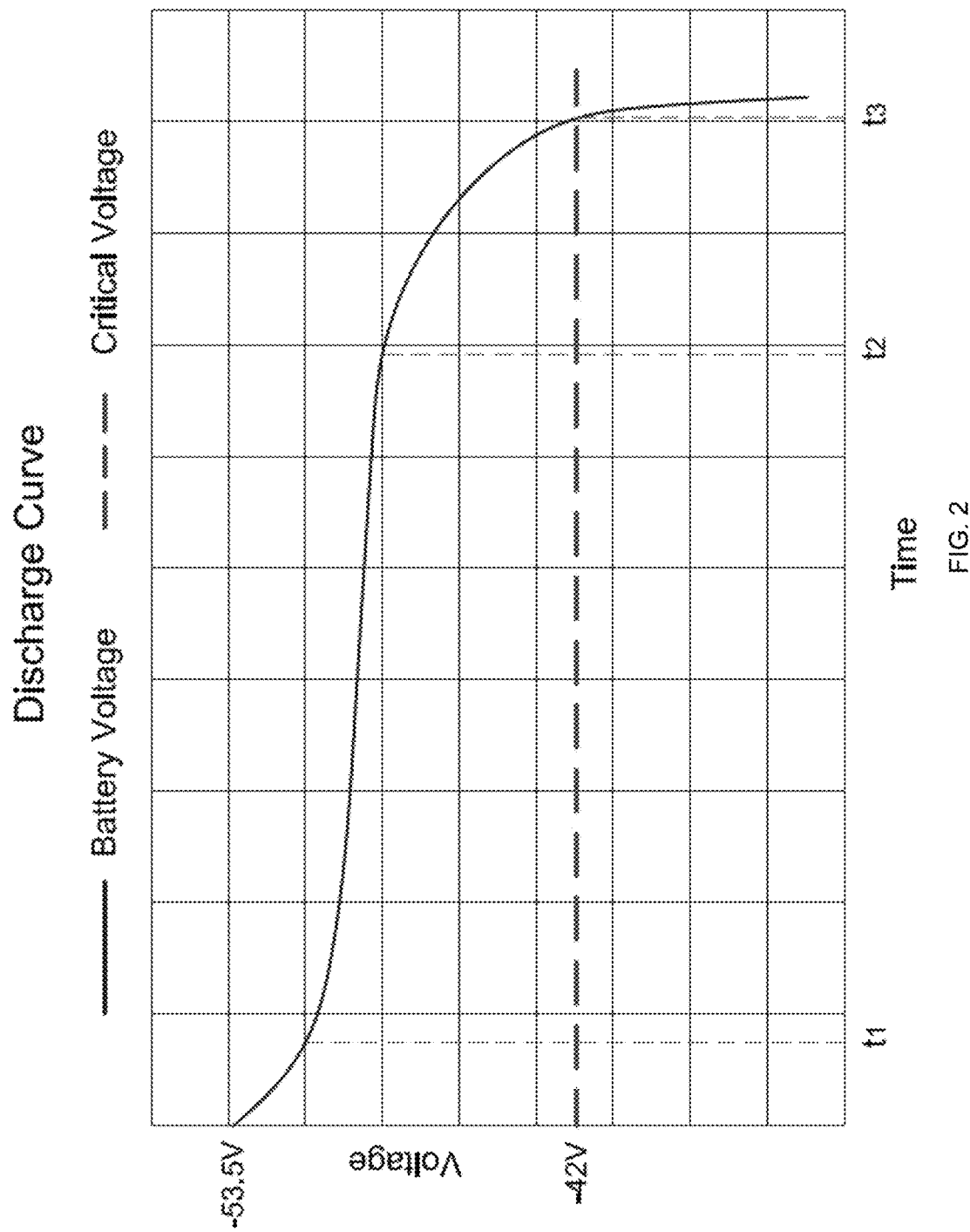
FIG. 2 shows an example battery discharge curve.

PTS 200 may include battery bank 108 and DC power supply 102 may drop below −53 Vdc. For example, utility grid 104 in FIG. 3A-3C may go off-line due to a lightning strike or down power line. In this case, DC-DC converter 210 may increase output voltage $V_{OUT}$ more than the amount used during normal grid powered conditions. As explained above in FIG. 2, battery bank 108 may only operate at −48 Vdc during normal charging and then further decrease voltage during a subsequent discharge state. By increasing the voltage added to $V_{IN}$ to produce $V_{OUT}$, DC-DC converter 210 may be able to operate RRH 122 for a longer period of time while being powered by battery bank 108.

Even when utility 104 comes back on-line, the voltage on DC bus 107 may require significant time to get back to −53.5 Vdc since DC power supply 102 may reach a current limit recharging battery bank 108. Therefore, DC-DC converter 210 may have significant time to reduce output voltage $V_{OUT}$ to avoid any overvoltage conditions at the RRH input.

Figure 11:
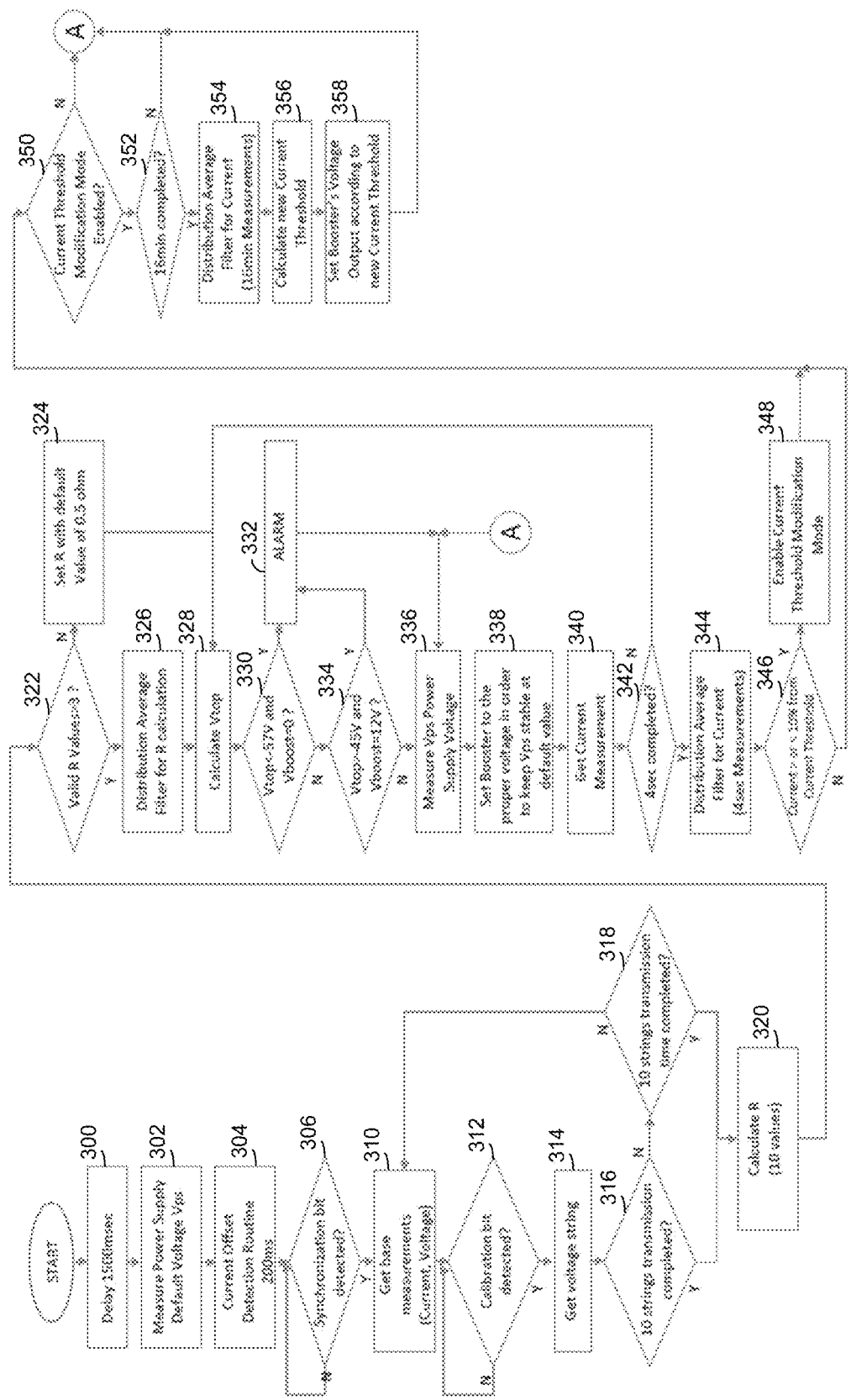
FIG. 11 shows an example process for adjusting the output voltage of a DC-DC converter based on a measured DC power cable resistance.
Figure 12:
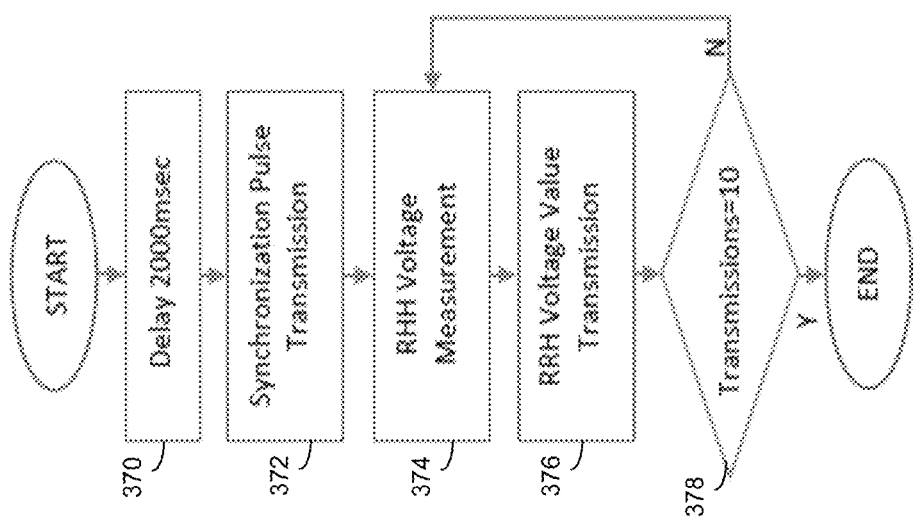
FIG. 12 shows a process used by the voltage monitor.
Figure 13:
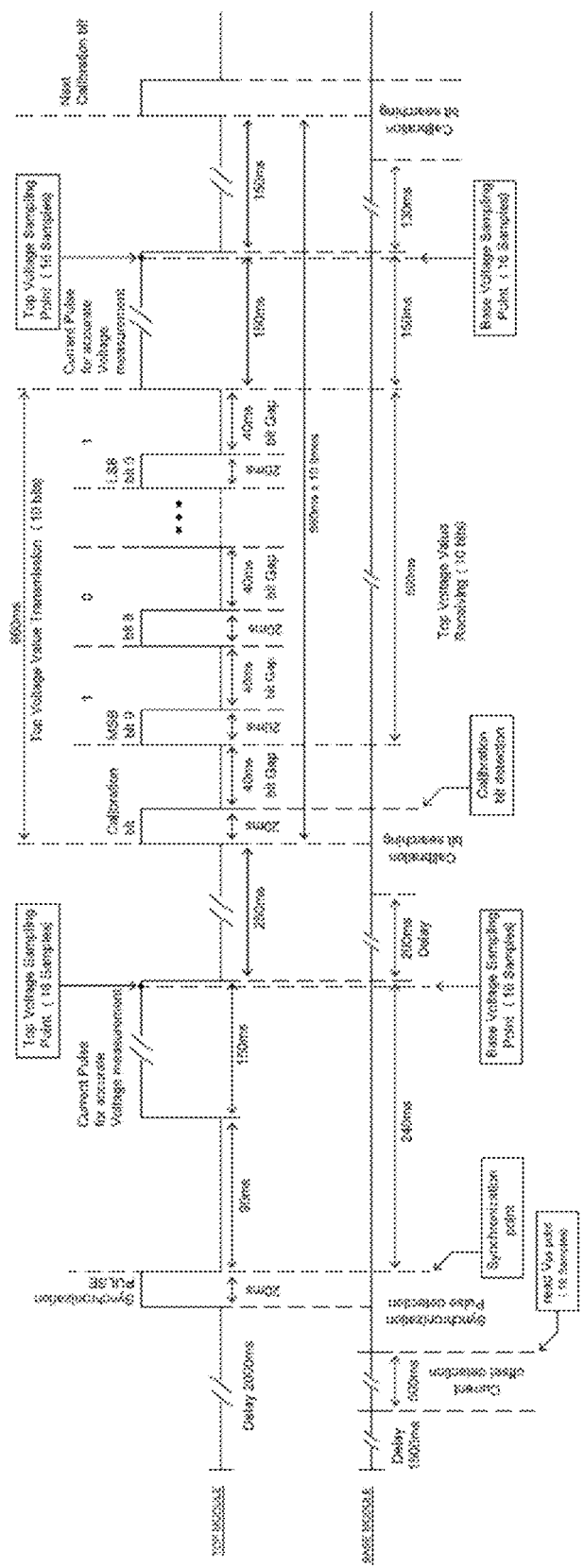
FIG. 13 shows the timing diagram for the transmission of the voltage measurements from the top module to the DC-DC converter.

FIG. 11 shows an example process used by DC-DC converter 210 for adjusting the output voltage. The $V_{RRH}$ voltage is transmitted by top module 230 to base module 210 with current pulses through the DC power cables. The current pulses are detected by current sensor 254 in base module 210 shown in FIGS. 5A and 5B. In the description below voltage monitor 230 is alternatively referred to as top module 230 and DC-DC converter 210 is alternatively referred to as base module 210. FIG. 12 shows the process used by the voltage monitor 230 (referred as top module). FIG. 13 shows the timing diagram for the transmission of the voltage measurements from the top module to the DC-DC converter.

When the system is powered on, there is a delay of 2000 msec (operation 370 at top module and 1500 msec at base module (operation 300) in order to wait for the RRH initialization and current stabilization. When the 1500 msec delay of the base module is passed, the base module tries to detect the current offset (operation 304) of the system before the RRH starts the transmission. The current offset is stored in memory if the current is stable for 100 msec. This is done in 500 msec after the base module delay (1500 msec).

At the next operation 306 the base module starts the detection of the synchronization pulse transmission from the top module (operation 372). The falling edge of the synchronization pulse is the synchronization point that performs the proper timing for the first voltage measurements (base and top). These measurements are the average of 16 successive voltage measurements. The top module transmits a current pulse of 150 msec width, after 90 msec from the synchronization point. This current pulse is used to increase the accuracy of the cable resistance calculation, as the current conducted by the RRH during the start-up process is typically very low and an accurate measurement of R is not possible. Increasing the current flow during this current pulse enables an accurate measurement of R.

At the end of this current pulse, the two voltage measurements at the top module (operation 374) and base module (operation 310) occur simultaneously. The base voltage measurement is stored in the base module memory and the top voltage measurement ($V_{RRH}$) is transmitted down to the base module in operation 376 by current pulses through the DC power cables. This transmission is composed of the calibration bit (detected in operation 312) and the conversion byte from the MSB (first) to LSB (last). The detection of the logical level 'high' or 'low' (1 or 0) of the current pulse is based, as mentioned above, on the integration of the current over time. The area that is calculated by the integration of the calibration bit current pulse over time is the template for the logical level 'high' and is used by the algorithm in order to separate the 'high' and 'low' logical levels of the bits of the conversion byte that follows.

The duration of this transmission is 660 msec [calibration bit (60 msec)+10*conversion bits (60 msec)]. The falling edge of each calibration bit is the synchronization point for the next voltage measurements (top and base). The time delay after each transmitted bit is required to achieve stability on the current due to the inductance and capacitance of the system (cable length introduces some inductance and there is significant capacitance at the output of the PS and the input of the RRH) and the non-linear behavior of the RRH load.

Next to the voltage conversion transmission is the current pulse transmission with 150 msec width, to increase the voltage measurements accuracy for the next voltage conversion. This conversion occurs at the end of the current pulse. The cycle that is described above is repeated 10 times in operations 316 and 378 and 10 pairs of voltage measurements (top and base) arises as a result. The cable resistance is calculated from those voltage pairs in combination with the current via distribution average filtering in operation 326. At the end of this timeline the top module turns in to idle state and the base module enables the DC/DC converter control routine.

Similar process for the DC-DC converter and top module could be used to transmit the top voltage $V_{RRH}$ to the base module via amplitude shift keying (ASK) modulation as shown in FIGS. 9 and 10. Top module 230 transmits a 7.5 MHz carrier frequency with up to an 80 Kbps transmission rate. Thus, the calculation of the cable resistance is faster than the current pulse method, as there is no need to have long delays between pulses for the current stabilization of the power system. The ASK signals are received by ASK demodulator 298 in base module 210 via frequency coupling through power cables 214. Transmitting the pulses at 7.5 MHz avoids interference with other signals generated in power transmission system 90. The 7.5 MHz pulses may not be affected by current fluxuations caused by RRH 122. Thus, voltage values can be measured and transmitted using ASK modulation at any time before or during RRH operation. In the case of voltage transmission during RRH operation (RRH in transmission mode) there is no need for additional current pulses in order to achieve accurate cable resistance measurements because of higher current conduction during RRH operation. The first and second transmission methods allow top module 230 to transmit $V_{RRH}$ to base module 210 without using additional communication cables between the bottom and top of the cell tower.

As also explained above, the third transmission method uses a RS-485 transmission protocol where top module 230 in FIG. 8 transmits digital voltage measurement values over communication link 212. Base module 210 in FIG. 5A or 5B receives the RS-485 signal from top module 230 that identifies the top voltage measurement $V_{RRH}$.

Base module 210 in operation 320 calculates cable resistance values for the ten voltage and current measurements taken in operations 310-314. If there are less than three valid resistance calculations for the power cable in operation 322, base module 210 in operation 324 may set the cable resistance to a default value of 0.5 ohms. If there are more than three valid independent power cable resistance calculations, base module 210 in operation 326 uses a distribution average filter in operation 326 to derive a final cable resistance value.

In operation 328, base module 210 uses the final cable resistance value to calculate the top voltage ($V_{RRH}$) as described above in equations 2 and 3. In one example, base module 210 may calculate $V_{RRH}$ every 100 usec. Base module 210 may generate an alarm in operation 332 when an overvoltage condition is identified in operation 330 where $V_{RRH}<-57$ Volts and the boost voltage $V_{boost}=0$. Base module 210 also may activate the alarm in operation 332 when a shutdown condition is detected in operation 334 where $V_{RRH}>-45$ volts and the boost voltage is at a maximum value of $V_{boost}=12V$.

In operation 336, base module 210 measures the power supply voltage Vps and in operation 338 sets the booster voltage Vboost to maintain Vps at a stable default value. In operation 340, base module 210 measures the current supplied by the power supply to RRH 122. During a 4 second period in operation 342, base module 210 repeatedly calculates $V_{RRH}$, measures Vps, sets the booster voltage Vboost, and measures the current.

In operation 344, base module 210 uses a distribution average filter on the current measurements to calculate a temporary current threshold $I_{TH}$. If the current threshold varies by 10% in operation 346 from the previous current threshold, base module 210 in operation 348 enables a current threshold modification mode.

When the current threshold modification mode is enabled in operation 350, base module 210 in operation 352 measures the current when RRH 122 is in a normal traffic state for 16 minutes. After 16 minutes, base module 210 in operation 354 applies a distribution average filter to the current measurements calculating a new current threshold in operation 356. In operation 358, base module 210 sets the booster voltage Vboost based on the new current threshold setting the voltage output of base module 210 to accommodate the associated cable voltage drop. Base module 210 may continuously repeat the above operations.

Figure 15A:
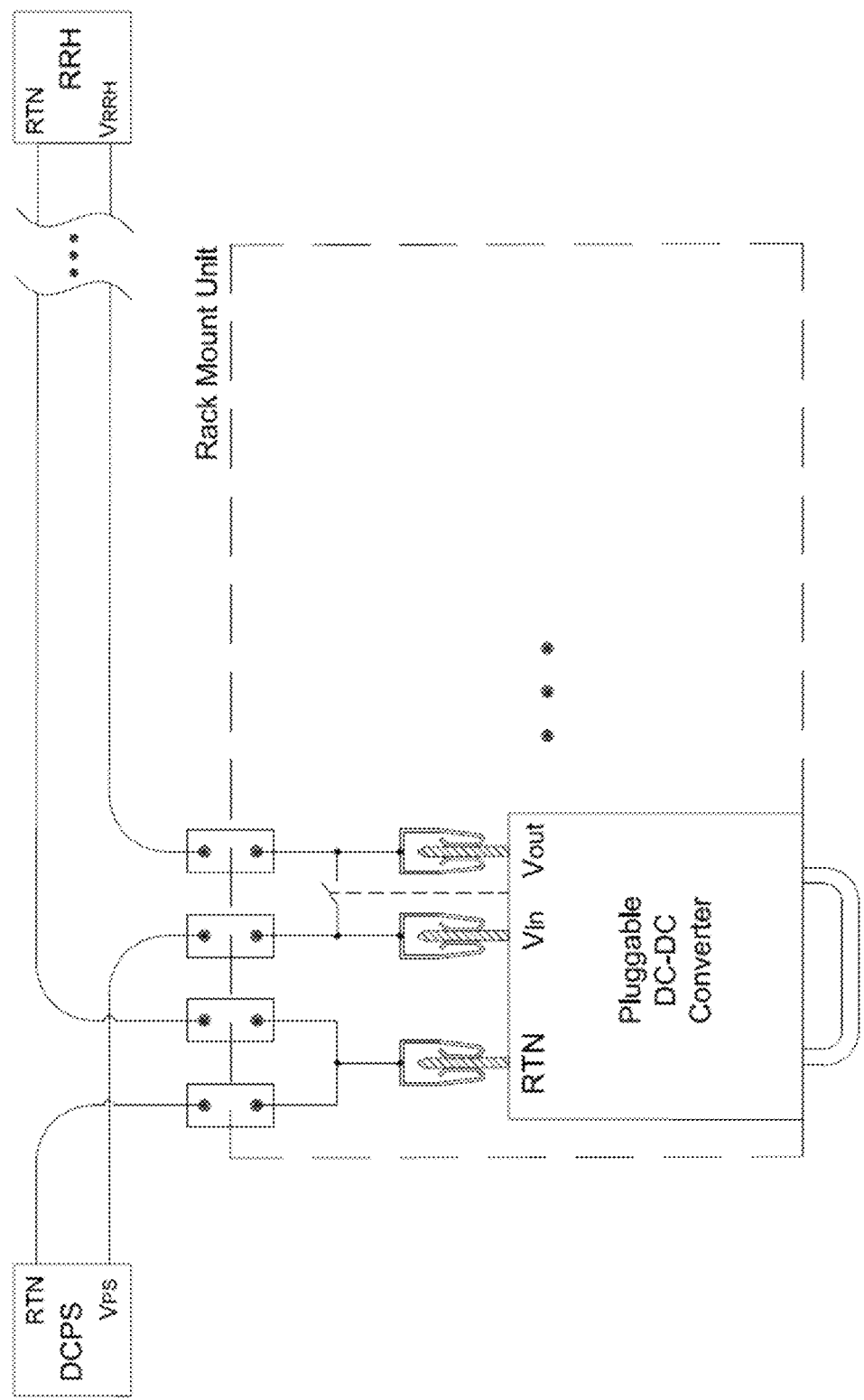
FIG. 15A shows circuit continuity between DCPS 102 and RRH 122 via a mechanical switch when the DC-DC converter is unplugged.

A possible implementation of the DC-DC converter 210 could be in a pluggable version that is plugged in a rack mount unit that will hold the connections (cable terminals) to the DC power line cables, as described in FIG. 15A. The voltage control system 202 is integrated inside the pluggable unit. The connection of the pluggable unit to the rack mount unit is implemented by knife type terminals. This connector type makes the removal of the DC-DC converter 210 from the rack device very easy.

When the DC-DC converter 210 is unplugged from the rack device there is a mechanical switch that is located on rack device side and is turned to its close position in order to keep the DCPS 102 and RRH 122 connected. When the DC-DC converter is plugged in the rack device the mechanical switch is turned open and the DCPS 102 is connected to RRH 122 through the DC-DC converter.

Figure 15B:
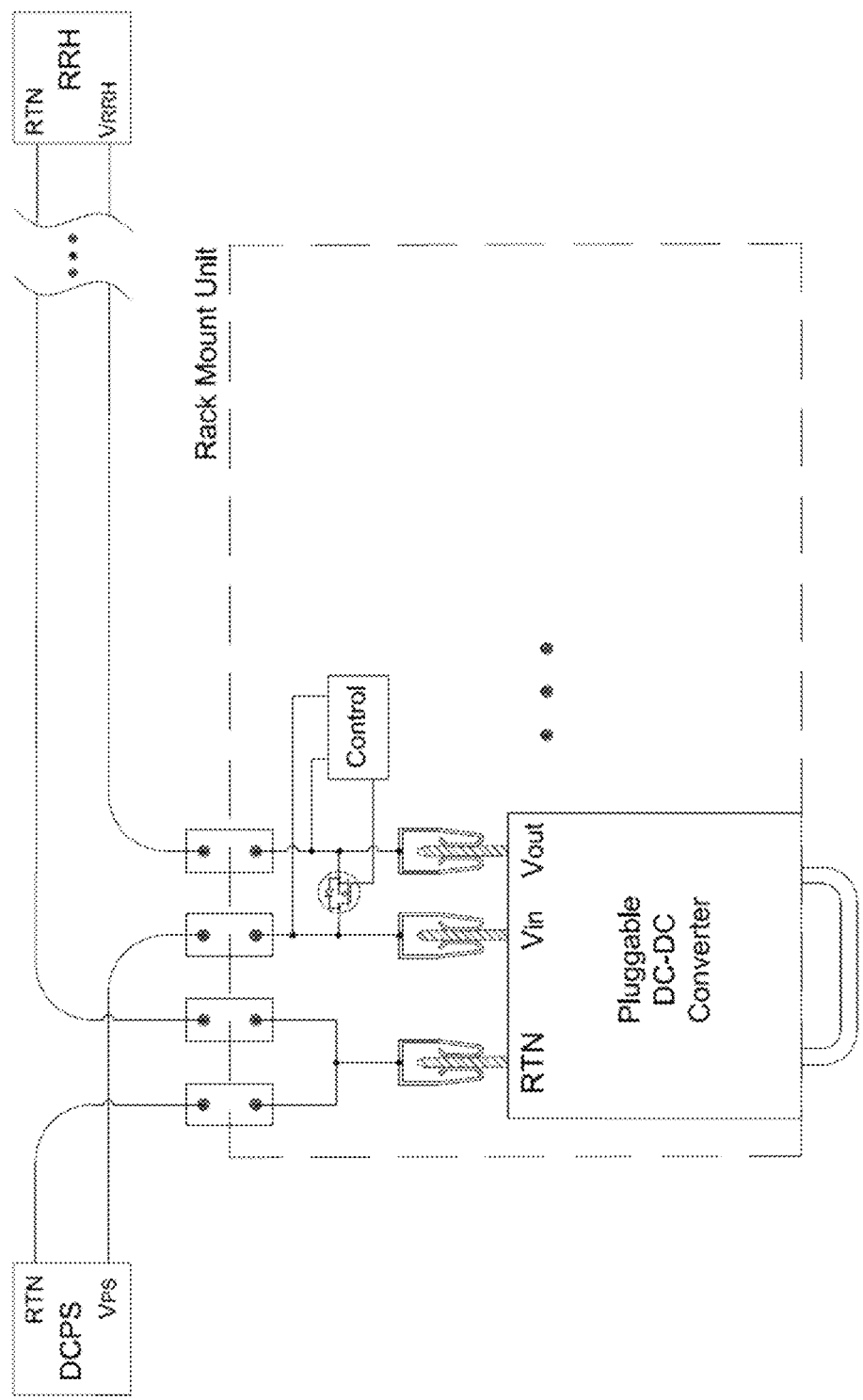
FIG. 15B shows an electrical diagram of the circuit continuity between DCPS 102 and RRH 122 via metal oxide semiconductor field effect transistor (MOSFET) switch when the DC-DC converter is unplugged.

Alternatively, in FIG. 15B, the mechanical switch may be replaced by the metal-oxide semiconductor field effect transistor (MOSFET) switch 253D or by the bypass diode 252D which may be placed at the rack device side instead of the DC-DC converter 210 side. Thus, when the DC-DC converter 210 is unplugged from the rack device the connection between DCPS 102 and RRH 122 remains through the metal-oxide semiconductor field effect transistor (MOSFET) switch 253D or through the bypass diode 252D.

In both cases, there will always be power to the RRH in case of any failure of the DC-DC converter and the operation of the RRH will not be interrupted. In contrast, a failure on an equivalent full scale converter will result in a loss of power on the RRH and end of its operation. Further, the pluggability of the DC-DC converter as described above enables its replacement without disturbing the operation of the RRH. In addition, in the case of using the ASK method to transmit the voltage levels from top to base, the calculation of the cable resistance could be done at any point after the DC-DC converter has been replaced, without the need to re-initialize the system.

The system described above can use dedicated processor systems, micro controllers, programmable logic devices, or microprocessors that perform some or all of the operations. Some of the operations described above may be implemented in software, such as computer readable instructions contained on a storage media, or the same or other operations may be implemented in hardware.

For the sake of convenience, the operations are described as various interconnected functional blocks or distinct software modules. This is not necessary, however, and there may be cases where these functional blocks or modules are equivalently aggregated into a single logic device, program or operation with unclear boundaries. In any event, the functional blocks and software modules or features of the flexible interface can be implemented by themselves, or in combination with other operations in either hardware or software.

References above have been made in detail to preferred embodiment. Examples of the preferred embodiments were illustrated in the referenced drawings. While preferred embodiments where described, it should be understood that this is not intended to limit the invention to one preferred embodiment. To the contrary, it is intended to cover alternatives, modifications, and equivalents as may be included within the spirit and scope of the invention as defined by the appended claims.

Having described and illustrated the principles of the invention in a preferred embodiment thereof, it should be apparent that the invention may be modified in arrangement and detail without departing from such principles. Claim is made to all modifications and variation coming within the spirit and scope of the following claims.

The invention claimed is:

1. A power transmission system, comprising:
a DC-DC converter configured to:
receive a DC input voltage ($V_{IN}$) from a power supply and generate an output voltage ($V_{OUT}$) to power at least one remote radio head (RRH);
determine a voltage drop on a DC cable connected between the DC-DC converter and the RRH based on a specific configuration of RRH;
apply voltage levels to $V_{IN}$ so $V_{OUT}$ compensates for the voltage drop; and
output $V_{OUT}$ on the DC cable to power the RRH, wherein $V_{OUT}$ does not change during operation unless there is a reconfiguration of the RRH that changes power consumption of the RRH.

2. The power transmission system of claim 1, wherein the DC-DC converter includes a control unit configured to:
receive a signal from a voltage measurement (VM) device located on a tower or roof where the RRH is located, the signal indicating a voltage ($V_{RRH}$) at an input of the RRH;
measure $V_{OUT}$ and an output current $I_{OUT}$ at an output of the DC-DC converter;
calculate a resistance of the DC cable ($R_{CABLE}$) based on $V_{RRH}$, $V_{OUT}$, and $I_{OUT}$; and
adjust the voltage levels applied to $V_{IN}$ so $V_{OUT}$ compensates for the voltage drop associated with $R_{CABLE}$.

3. The power transmission system of claim 2, wherein the DC-DC converter includes a current sensor for determining $V_{RRH}$ based on current pulses transmitted over the DC cable by the VM device.

4. The power transmission system of claim 3, wherein a duration of the current pulses is increased to increase reception accuracy due to capacitance distortion.

5. The power transmission system of claim 3, wherein the control unit is further configured to generate a voltage pulse on the DC cable that causes the VM device to start generating the current pulses.

6. The power transmission system of claim 2, wherein the control unit measures $I_{OUT}$ during a start-up period of the RRH when a voltage monitor at the RRH generates a current pulse to increase current flow in the cable while calculating $R_{CABLE}$.

7. The power transmission system of claim 2, wherein the control unit is further configured to receive the signal indicating $V_{RRH}$ over a communication link connected between the DC-DC converter and the VM device.

8. The power transmission system of claim 2, wherein the DC-DC converter includes an amplitude shift keying (ASK) demodulator for determining $V_{RRH}$ based on a modulated ASK pulses transmitted over the DC cable by the VM device.

9. The power transmission system of claim 8, wherein the ASK pulses are generated at 7.5 megahertz (MHz).

10. The power transmission system of claim 1, wherein the DC-DC converter includes:
multiple converter modules coupled between $V_{IN}$ and $V_{OUT}$ to add associated voltage steps to $V_{IN}$, the converter modules; and
a control circuit configured to enable different combinations of the converter modules to add different combinations of voltage steps to $V_{IN}$.

11. The power transmission system of claim 10, including switches connected across outputs for each of the converter modules selectively activated by the control circuit.

12. The power transmission system of claim 11, including a hall effect sensor coupled in series between the switches and $V_{OUT}$.

13. The power transmission system of claim 10, including a bypass switch coupled across all of the outputs of the converter modules and selectively activated by the control circuit to reduce or prevent a voltage drop between $V_{IN}$ and $V_{OUT}$.

14. The power transmission system of claim 13, wherein the bypass switch comprises a diode.

15. The power transmission system of claim 13, wherein the bypass switch comprises a metal-oxide semiconductor field effect transistor (MOSFET).

16. The power transmission system of claim 1, wherein the DC-DC converter is further configured to:
calculate a threshold current $I_{TH}$ for the RRH;
determine a new voltage drop on the DC cable based on detected changes in $I_{TH}$;
apply different voltage levels to $V_{IN}$ so $V_{OUT}$ compensates for the new voltage drop.

17. The power transmission system of claim 1, wherein the DC-DC converter is further configured to:
select a target voltage for the input of RRH; and
apply the voltage levels to $V_{IN}$ so $V_{OUT}$ minus the voltage drop on the DC cable produces the target input voltage.

18. The power transmission system of claim 17, wherein the target voltage is substantially a maximum operating voltage for RRH.

19. The power transmission system of claim 1, wherein the DC-DC converter is further configured to:
monitor a threshold operating current ($I_{TH}$) for RRH;
increase the voltage levels applied to $V_{IN}$ when $I_{TH}$ increases; and
decrease the voltage levels applied to $V_{IN}$ when $I_{TH}$ decreases.

20. A computer program stored in a non-transitory media for controlling voltage at a remote radio head (RRH), the computer program comprising a set of instructions operable to:
identify a specific configuration of the RRH;
read an input voltage ($V_{IN}$) received from a DC power supply;
read an output voltage ($V_{OUT}$) generated from $V_{IN}$ at a base of a DC cable;
read an output current ($I_{OUT}$) at the base of the DC cable;
receive a voltage measurement ($V_{RRH}$) taken at a top of the DC cable at an input of the RRH;
calculate a resistance of the DC cable ($R_{CABLE}$) based on $V_{RRH}$, $V_{OUT}$, and $I_{OUT}$;
calculate a voltage drop on the DC cable based on $R_{CABLE}$, $I_{OUT}$ and the specific configuration of the RRH;
identify a target voltage level at the input of the RRH; and
adjust a voltage added to $V_{IN}$ so $V_{OUT}$ compensates for the voltage drop on the DC cable and produces the target voltage level at the input of the RRH, wherein $V_{OUT}$ does not change during operation unless there is a reconfiguration of the RRH that changes power consumption of the RRH.

21. The computer program of claim 20, further comprising instructions operable to:
calculate a boost voltage ($V_{boost}$) to compensate for the voltage drop on the DC cable; and
configure converter modules to add $V_{boost}$ to $V_{IN}$.

22. The computer program of claim 20, further comprising instructions operable to:
calculate a current operating threshold ($I_{TH}$) for RRH;
calculate a new resistance of the DC cable and a new voltage drop on DC cable based on a detected change in the $I_{TH}$; and
readjust the voltage added to $V_{IN}$ so $V_{OUT}$ compensates for the new voltage drop on the DC cable and maintains the target voltage level at the input of the RRH.

23. The computer program of claim 20, further comprising instructions operable to:
detect an outage of the DC power supply;
readjust the voltage added to $V_{IN}$ based on the detected outage to compensate for a new lower value of $V_{IN}$ provided by a backup battery bank.

24. The computer program of claim 20, comprising instructions operable to:
generate a voltage pulse on the DC cable to activate a voltage measurement device at the top of the DC cable to take the voltage measurement $V_{RRH}$; and
determine the $V_{RRH}$ based on current pulses generated by the voltage measurement device over the DC cable in response to the voltage pulse.

25. The computer program of claim 20, comprising instructions operable to receive the voltage measurement $V_{RRH}$ over a communication link from a voltage measurement device located at the top end of the DC cable.

26. A voltage monitoring device, comprising:
a hardware processor configured to:
measure a voltage ($V_{RRH}$) at a first end of a DC cable on a tower or on a rooftop where an RRH is located; and
transmit $V_{RRH}$ to a voltage control system at a second end of the DC cable to calculate a voltage drop across the DC cable and generate voltage steps that produce an output voltage $V_{OUT}$ at the second end of the DC cable that compensate for the voltage drop based on a specific configuration of the RRH, wherein $V_{OUT}$ does not change during operation unless there is a reconfiguration of the RRH that changes power consumption of the RRH.

27. The voltage monitoring device of claim 26, further comprising a resistor and a transistor coupled to the DC cable, the processor activating the transistor to generate current pulses on the DC cable that indicate $V_{RRH}$.

28. The voltage monitoring device of claim 27, wherein the processor is further configured to:
monitor the DC cable for a voltage pulse from the voltage control system; and
generate the current pulses in response to detecting the voltage pulse.

29. The voltage monitoring device of claim 27, further comprising a relay coupled between the resistor and the DC cable, the processor opening the relay to isolate the transistor and the transistor from the DC cable.

30. The voltage monitoring device of claim 26, wherein the processor is further configured to:
monitor the $V_{RRH}$ for different RRHs located on the tower or on the roof; and
transmit digital signals over a communication link to the voltage control system identifying the $V_{RRH}$ for the different RRHs.

31. The voltage monitoring device of claim 26, further comprising:
an amplitude shift keying (ASK) modulator coupled to the hardware processor to generate an ASK signal based on a series of encoded bits generated by the hardware processor that identifies $V_{RRH}$; and
a transformer coupled between the DC cable and the ASK modulator configured to apply the ASK signal to a DC voltage on the DC cable.

32. A power transmission system, comprising:
a voltage measurement device located on a tower or rooftop for measuring a voltage ($V_{RRH}$) at a top end of a DC cable connected a remote radio head (RRH);
a voltage control system connected to a base end of the DC cable, the voltage control system configured to:
receive an input voltage ($V_{IN}$) from a DC power supply;
measure an output voltage ($V_{OUT}$) at a base end of the DC cable;
receive the measurement for $V_{RRH}$ from the voltage measurement device;
calculate a voltage drop on the DC cable based on the measurement for $V_{RRH}$; and a specific configuration of the RRH, and
add different voltage steps to $V_{IN}$ so $V_{OUT}$ compensates for the voltage drop on the DC cable, wherein $V_{OUT}$ does not change during operation unless there is a reconfiguration of the RRH that changes power consumption of the RRH.

33. The power transmission system of claim 32, wherein the voltage control system includes a DC-DC converter including an input coupled to the DC power supply and an output coupled to the base end of the DC cable, wherein the DC-DC converter includes:
multiple converter modules coupled between the input and the output of the DC-DC converter to add the different voltage steps to $V_{IN}$; and
a control circuit configured to selectively activate the converter modules based on the voltage drop on the DC cable.

34. The power transmission system of claim 32, wherein the DC-DC converter includes a current sensor for detecting current pulses transmitted by the voltage measurement device as the measurement signal for $V_{RRH}$.

35. The power transmission system of claim 32, wherein the DC-DC converter includes a coupling transformer and an amplitude shift keying (ASK) demodulator for detecting ASK pulses transmitted by the voltage measurement device as the measurement signal for $V_{RRH}$.

36. The power transmission system of claim 32, wherein the DC-DC converter is further configured to:
monitor a current threshold ($I_{TH}$) for the RRH;
recalculate the voltage drop on the DC cable based on detected changes in the $I_{TH}$; and
readjust the voltage steps added to $V_{IN}$ so $V_{OUT}$ compensates for the recalculated voltage drop.

* * * * *